United States Patent [19]

Shishiguchi et al.

[11] Patent Number: 4,992,301

[45] Date of Patent: Feb. 12, 1991

[54] CHEMICAL VAPOR DEPOSITION APPARATUS FOR OBTAINING HIGH QUALITY EPITAXIAL LAYER WITH UNIFORM FILM THICKNESS

[75] Inventors: Seiichi Shishiguchi; Fumitoshi Toyokawa; Masao Mikami, all of Tokyo, Japan

[73] Assignee: NEC Corporation, Tokyo, Japan

[21] Appl. No.: 247,850

[22] Filed: Sep. 22, 1988

[30] Foreign Application Priority Data

| Sep. 22, 1987 | [JP] | Japan | 62-239603 |
| Sep. 22, 1987 | [JP] | Japan | 62-239605 |
| Sep. 22, 1987 | [JP] | Japan | 62-239607 |
| Sep. 29, 1987 | [JP] | Japan | 62-247176 |
| Mar. 15, 1988 | [JP] | Japan | 63-62553 |

[51] Int. Cl.$^5$ ............................................. C23C 16/00
[52] U.S. Cl. .................................... 427/51; 156/611; 156/613; 118/730; 118/724; 437/81; 148/DIG. 6
[58] Field of Search ............... 118/724, 730; 427/51; 156/611, 613; 437/81; 148/DIG. 6

[56] References Cited

U.S. PATENT DOCUMENTS 4,745,088  5/1988  Inoue et al. ..................... 156/611

FOREIGN PATENT DOCUMENTS 173712  7/1987  Japan .

OTHER PUBLICATIONS

Ban et al, *Proceedings of the Seventh International Conference on Chemical Vapor Deposition* pp. 102-125 (1979).
Ban, *Journal of Crystal Growth* pp. 97-107 (1978).

*Primary Examiner*—Melvyn J. Andrews
*Attorney, Agent, or Firm*—Burns, Doane, Swecker & Mathis

[57] ABSTRACT

A chemical vapor deposition apparatus includes a reaction tube, a substrate-holder installed in the reaction tube, the substrate-holder holding a plurality of substrates in a vertical direction, surfaces of the substrates being held horizontally, a rotating-means for rotating the substrate-holder, a heating-means for heating the substrates, a first gas-supply nozzle tube installed vertically in the reaction tube, the first gas-supply nozzle tube having a first vertical gas-emission line of a plurality of first gas-emission holes aligned in a vertical direction, and a second gas-supply nozzle tube installed vertically in the reaction tube, the second gas-supply nozzle tube having a second vertical gas-emission line, a plurality of second gas-emission holes aligned in a vertical direction, a first gas-emitting-axis of the first gas-emission holes intersecting with a second gas-emitting-axis of the second gas-emission holes at a first intersection over the substrate, the first intersection of the first and second gas-emitting axes being deviated from the rotation center of the substrate-holder.

10 Claims, 19 Drawing Sheets

FIG. 1
FIG. 6
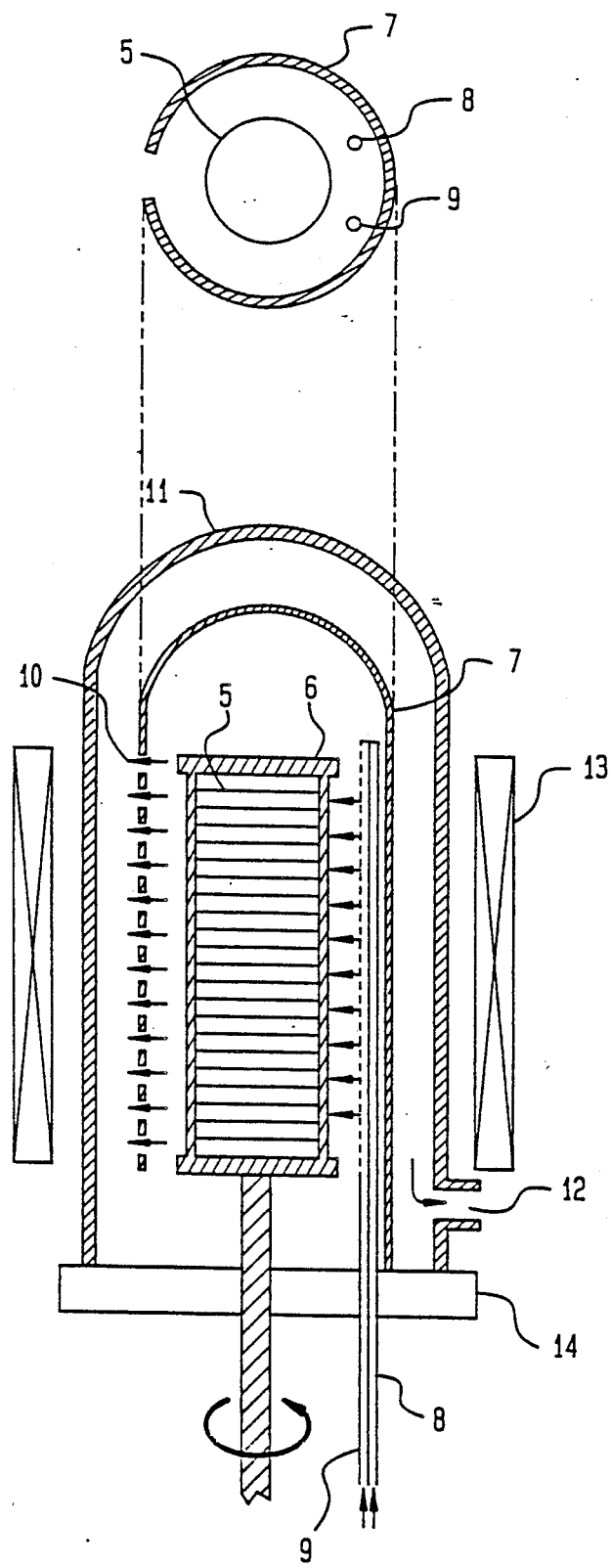
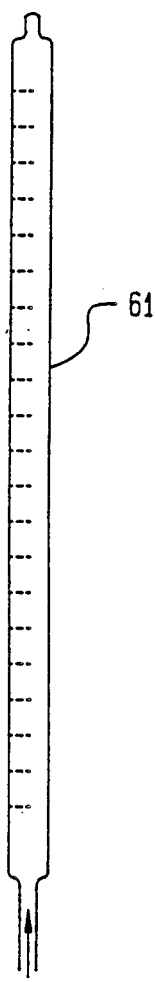

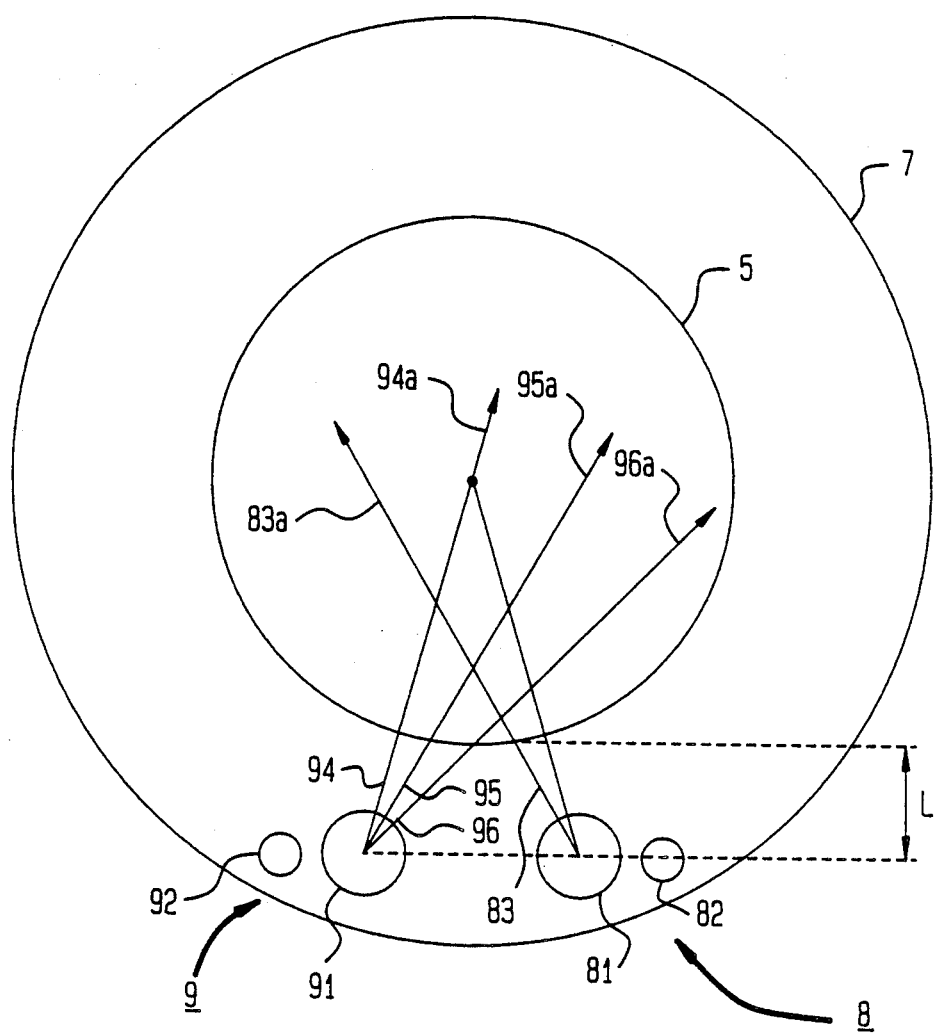

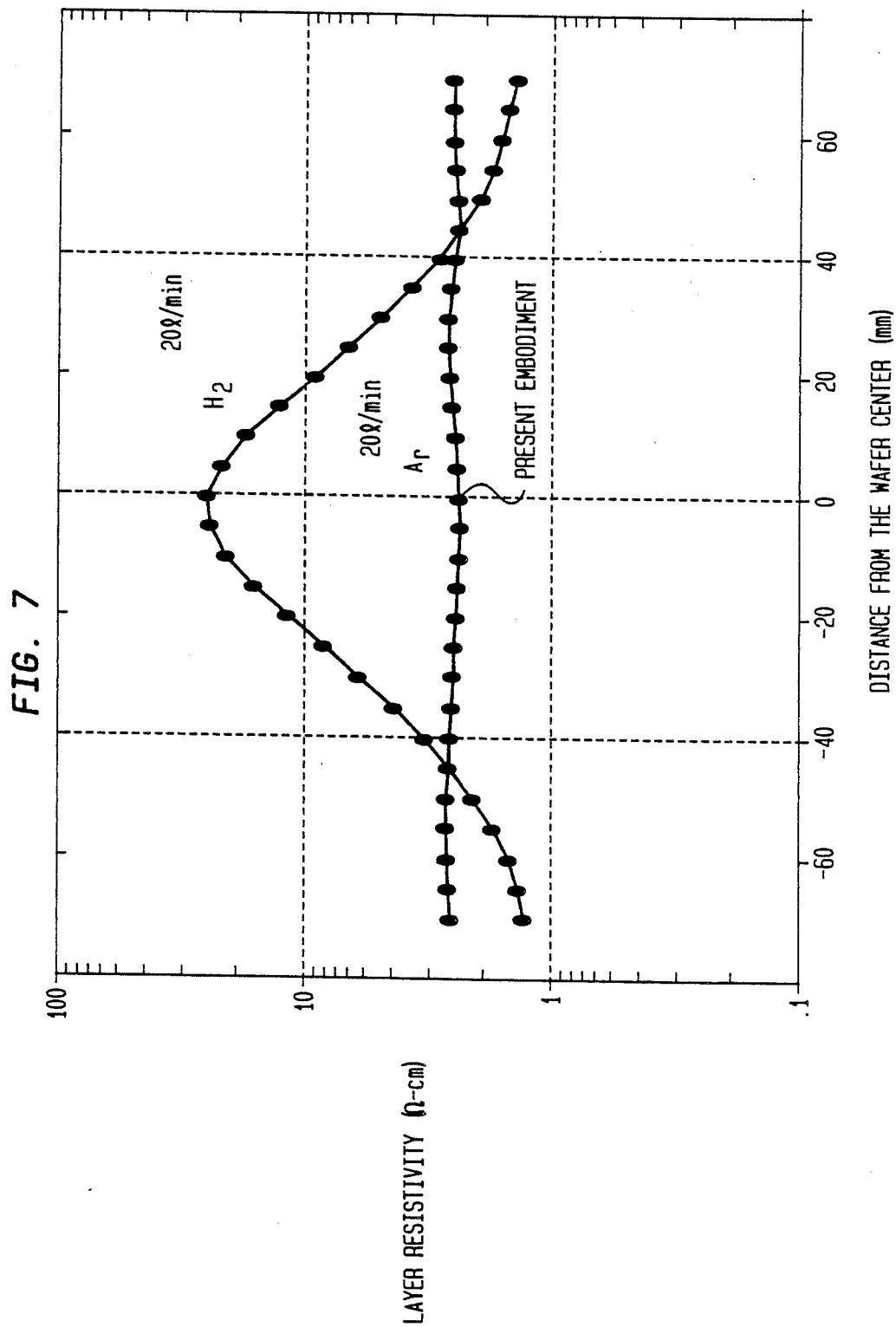

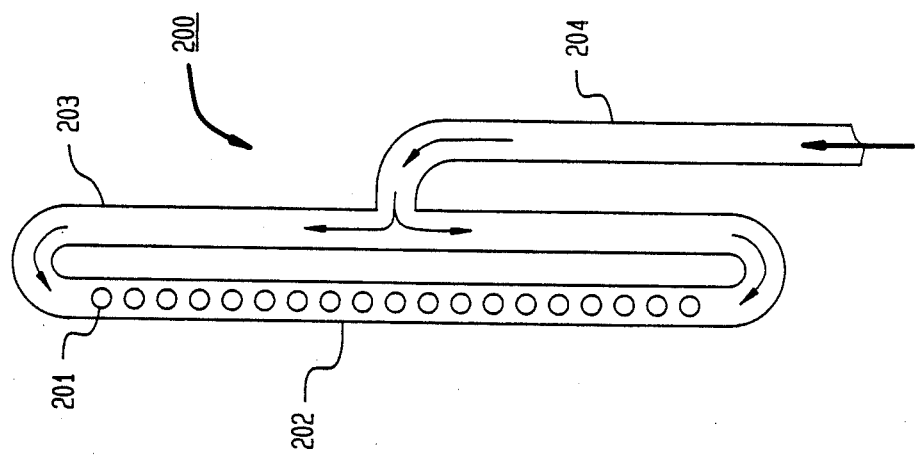
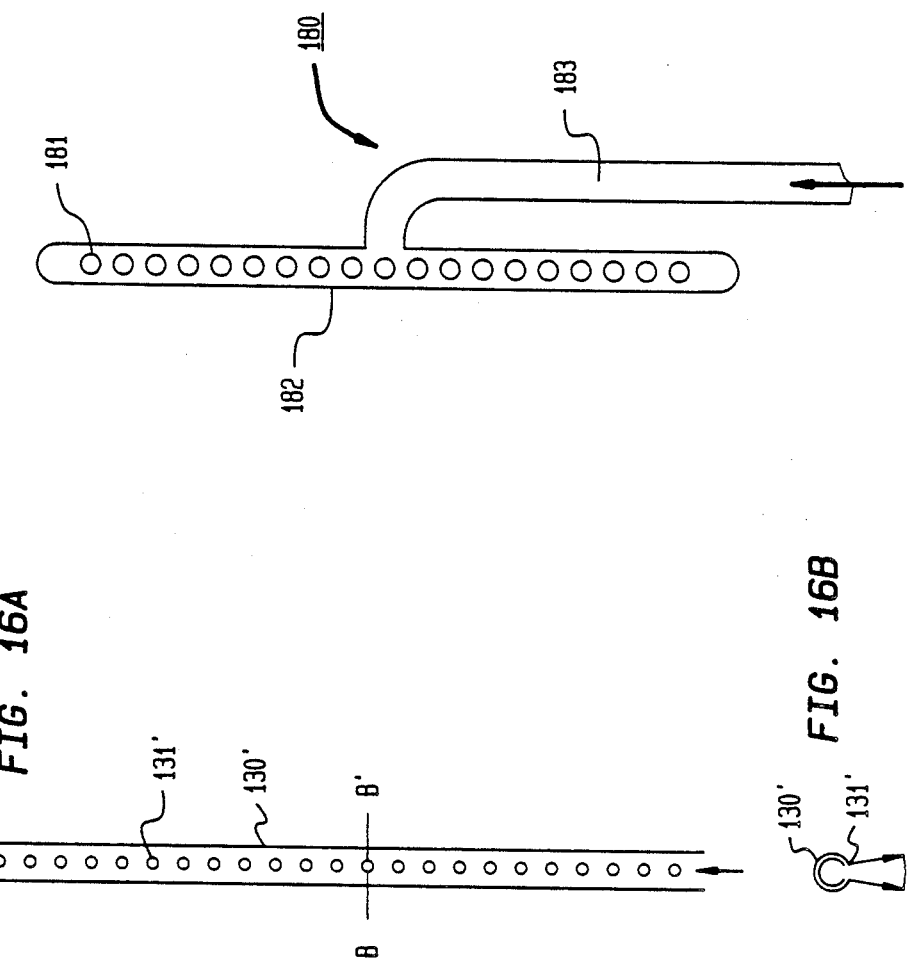
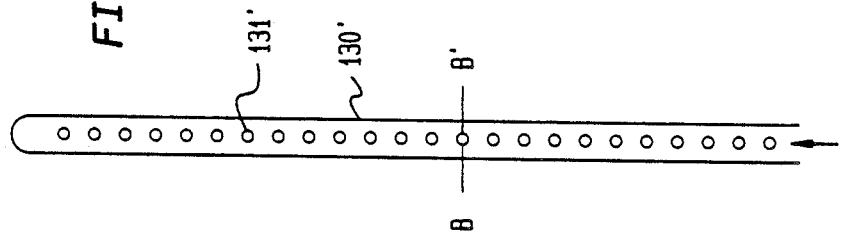

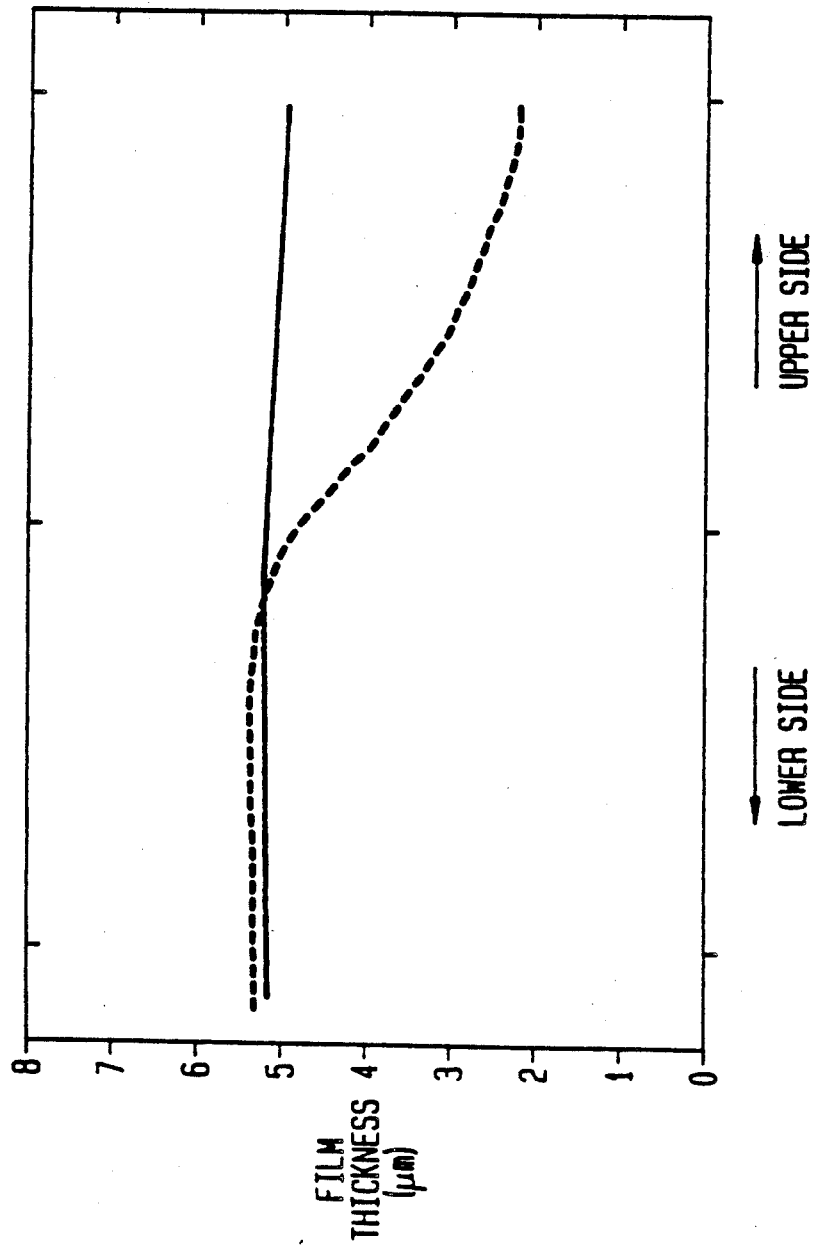

CHEMICAL VAPOR DEPOSITION APPARATUS FOR OBTAINING HIGH QUALITY EPITAXIAL LAYER WITH UNIFORM FILM THICKNESS

BACKGROUND OF THE INVENTION

1. Field of the Invention

The present invention relates to a chemical vapor deposition (CVD) apparatus and, more particularly, to a CVD apparatus for silicon epitaxial growth.

2. Description of the Related Art

A demand for Si epitaxial wafers (Si wafers with epitaxial films) has been enhanced to obtain high quality bipolar, Bi-CMOS, CCD and other semiconductor devices. Additionally, diameters of the Si wafers have become as large as 5 to 6 inches to reduce the process costs. However, since a wafer-processing capacity of the conventional CVD apparatus was small, a large number of Si wafers of large diameters could not be treated simultaneously, resulting in the expensive cost for manufacturing epitaxial wafers. Moreover, the uniform film thickness and the uniform crystal quality could not be obtained over the entire Si wafer of large diameter.

For improving a growth of the uniform epitaxial layer on the Si wafer of large diameter, a CVD apparatus was proposed in Japanese Laid open patent No. 62-173712. In this CVD apparatus, Si wafers having diameters of 6 inches were vertically stacked in a wafer holder. To obtain a uniformity of the epitaxial layers, the wafer holder was rotated so as to supply the starting gases on the Si wafers through holes of a gas-supply nozzle tube, the direction of the holes being deviated from the rotation center of each Si wafer. In this CVD apparatus, however, the number of the gas-supply nozzle tube was only one. Thus, the flow of the starting gases over the Si wafer was still nonuniform, especially over the Si wafer of a large diameter. Therefore, the obtained uniformity of the epitaxial layer does not have a level required for using for large-scale integrated circuits.

SUMMARY OF THE INVENTION

It is, therefore, a major object of the present invention to provide a CVD apparatus for obtaining an improved uniformity of epitaxial layers on a Si wafers having a large diameter.

The CVD apparatus in accordance with the present invention includes a reaction tube, a wafer holder installed in the reaction tube, the wafer holder having holding-means for stacking Si wafers in a vertical direction, a rotating-means for rotating the wafer holder, a heating-means for heating the Si wafers, a first and a second gas-supply nozzle tubes installed in the reaction tube, each of the nozzle tubes having a plurality of gas-emission holes arranged in the vertical direction to introduce starting gases on the Si wafers, gas-emitting-axes of the gas-emission holes of the first and second gas-supply nozzle tubes intersecting each other over the Si wafer and the intersection being deviated from the center of the Si wafer.

Since the starting-gases are supplied from the two nozzle tubes and the gas-emitting-axes from the two nozzle tubes intersect each other at the point deviated from the center of the Si wafer, the flow of the starting-gases become uniform over the Si wafers having large diameters. To obtain more uniform gas flow, a third gas-supply nozzle tube may be added to the first and second gas-supply nozzle tubes, the two gas-emitting-axes of the gas-emission holes of the first and third gas-supply nozzle tubes and the two gas-emitting-axes of the second and third gas-supply nozzle tubes respectively intersecting each other over the Si wafer and these intersections being also deviated from the center of each Si wafer.

The gas-emission holes may be formed in the plural columns, each of the columns having the gas-emission holes in a vertical direction. The gas-supply nozzle tube favorably has gas-inlet portions at its both ends. The gas-supply nozzle tube also favorably has a gas inlet portion at its center.

BRIEF DESCRIPTION OF THE DRAWINGS

The above and further objects, features and advantages of the present invention will become more apparent from the following detailed description taken in conjunction with the accompanying drawings, wherein:

FIG. 1 is a sectional view showing a CVD apparatus in accordance with the first embodiment of the present invention;

FIG. 3 is a sectional view for explaining an arrangement of the nozzle tubes used in the first embodiment of the present invention;

FIG. 6(a) is a front view of the nozzle tube used in obtaining the reference data shown in FIG. 5;

FIG. 7 is a diagram showing a relationship between the positions on the Si wafer and the resistivity of the epitaxial layers and for explaining the effect of the carrier gas;

FIG. 16(a) is a front view of the nozzle tube used in obtaining the reference data shown in FIG. 15;

FIG. 16(b) is a sectional view of the nozzle tube shown in FIG. 16(a);

FIG. 18 is a front view of the nozzle tube used in the sixth embodiment of the present invention;

FIG. 19 is a diagram showing a relationship between the positions of the Si wafers and the film thickness of the epitaxial layers in accordance with the sixth embodiment of the present invention;

FIG. 20 is a front view of the nozzle tube used in the seventh embodiment of the present invention;

DESCRIPTION OF THE PREFERRED EMBODIMENTS

First Embodiment

Figure 2A:
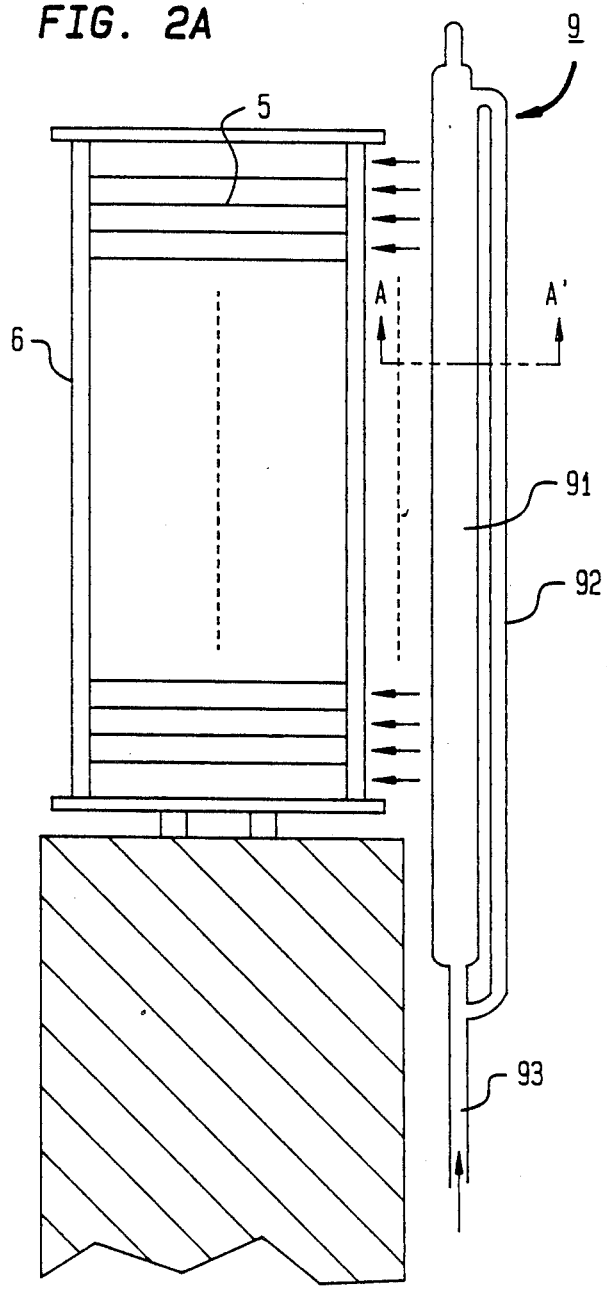
FIG. 2(a) is a sectional view for explaining a nozzle tube used in the first embodiment of the present invention.

Referring to FIG. 1, an outer reaction tube 11 and an inner reaction tube 7 having an inner diameter of 240 mm are installed on a pedestal 14. A wafer holder 6 is installed in the inner reaction tube 7. In the wafer holder 6, 30 Si wafers 5 having a diameter of 6 inches are piled in a vertical direction with a space of 10 mm. Gas-supply nozzle tubes 8 and 9 are installed vertically near the wafer holder 6. Starting-gases are introduced through the nozzle tubes 8 and 9 over the Si wafers 5 and exhausted through holes 10 formed in the wall of the inner reaction tube 7 and a vent 12 formed in the outer reaction tube 11. The Si wafers 5 are heated by a resistance-heating furnace 13.

Figure 2B:
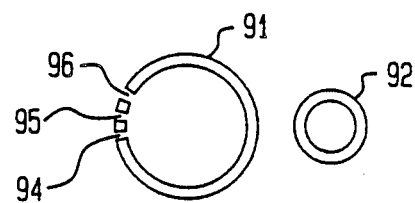
FIG. 2(b) is a sectional view along A—A' line in FIG. 2(a)

Referring to FIG. 2(a) and 2(b), a typical form of the nozzle tube 9 is shown and is formed of a main nozzle tube 91 having an inner diameter of 20 mm and having gas-emission holes 94, 95 and 96 of an inner diameter of 1 mm, a branch nozzle tube 92 of an inner diameter of 10 mm, and a gas-inlet tube 93 of an inner diameter of 10 mm connected to both the bottom ends of the main and branch nozzle tubes 91 and 92. The top end and the bottom end of the branch nozzle tube 92 are respectively connected to the top end and the bottom end of the main nozzle tube 91. The interval of the gas-emission holes 94, 95 and 96 in the vertical direction is 10 mm, the holes 94, 95 and 96 being respectively positioned between adjacent Si wafers 5 to introduce the starting-gases over each Si wafer 5.

Referring now to FIG. 3, the nozzle tube 8 has a main nozzle tube 81 and a branch nozzle tube 82 and has a similar structure to the nozzle tube 9 but has only one gas-supply column in which many gas-emission holes 83 are formed in the vertical direction. The space L between the edge of the Si wafer 5 and the centers of the nozzle tube 81 and 91 is 35 mm. The line connecting the center of the Si wafer 5 and the center of the main nozzle tube 81 intersects the line connecting the center of the Si wafer 5 and the center of the main nozzle tube 91 with an angle of 30°.

A gas-emitting-azis 83a of a gas blown from the gas-emission hole 83 (hereinafter, the line connecting the center of a main nozzle tube and the center of a gas-emission hole formed in the wall of the main nozzle tube is referred to as a gas-emitting-axis of its gas-emission hole; therefore, in this case, this gas-emitting-axis 83a of the gas-emission hole 83 is identical with the line connecting the center of the main nozzle 81 and the center of the gas-emission hole 83) is deviated from the center of Si wafer 5 toward its left-hand side. The angle of this gas-emitting-axis 83a formed with the line connecting both the centers of the Si wafer 5 and the main nozzle tube 81 is designed at 15°. A gas-emitting-axis 94a of the gas-emission hole 94 passes just above the center of the Si wafer 5. A gas-emitting-axis 95a of the gas-emission hole 95 is deviated from the center of the Si wafer 5 toward its right-hand side. The angle between this gas-emitting-axis 95a and the line connecting both the centers of the Si wafer 5 and the main nozzle 91 is designed at 15°. A gas-emitting-axis 96a of the gas-emission hole 96 is deviated from the center of the Si wafer 5 toward its right-hand side. The angle between this gas-emitting-axis 96a and the line connecting both the centers of the Si wafer 5 and the main nozzle 91 is designed at 30°.

Referring back to FIG. 1 and FIG. 3, a mixture of Ar, $SiH_2Cl_2$, HCl and $PH_3$ is introduced into the inner reaction tube 7 through the nozzle tube 9, together with $H_2$ introduced through the nozzle tube 8. Flow rates of Ar, $SiH_2Cl_2$, HCl and $H_2$ are respectively controlled at 20 l/min, 400 cc/min, 300 cc/min and 20 l/min. $PH_3$ of 50 ppm in Ar is 300 times diluted by $H_2$ and thus diluted gas is introduced at a flow rate of 50 cc/min. Epitaxial growth is carried out at 1,000° C, keeping the total pressure in the inner reaction tube 7 at 10 Torr. The film thickness of the epitaxial layer is measured by an IR interference method, the resistivity of the epitaxial layer being measured by a four-point probe technique.

Figure 4A:
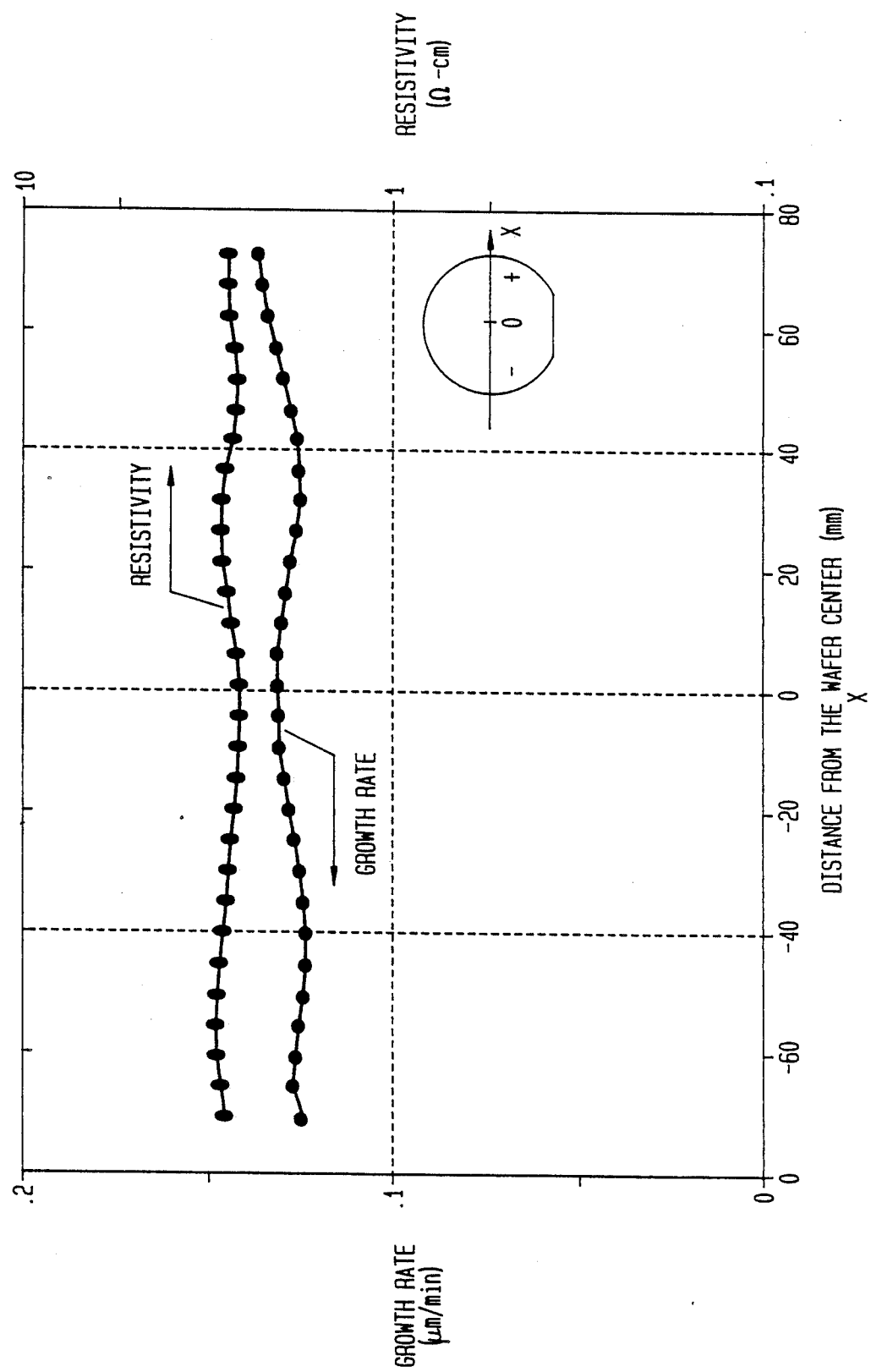
FIG. 4(a) is a diagram showing a relationship between the positions on the Si wafer and the growth rate of the epitaxial layer and a relationship between the positions on the Si wafer and the resistivity of the epitaxial layer in accordance with the first embodiment of the present invention.
Figure 4B:
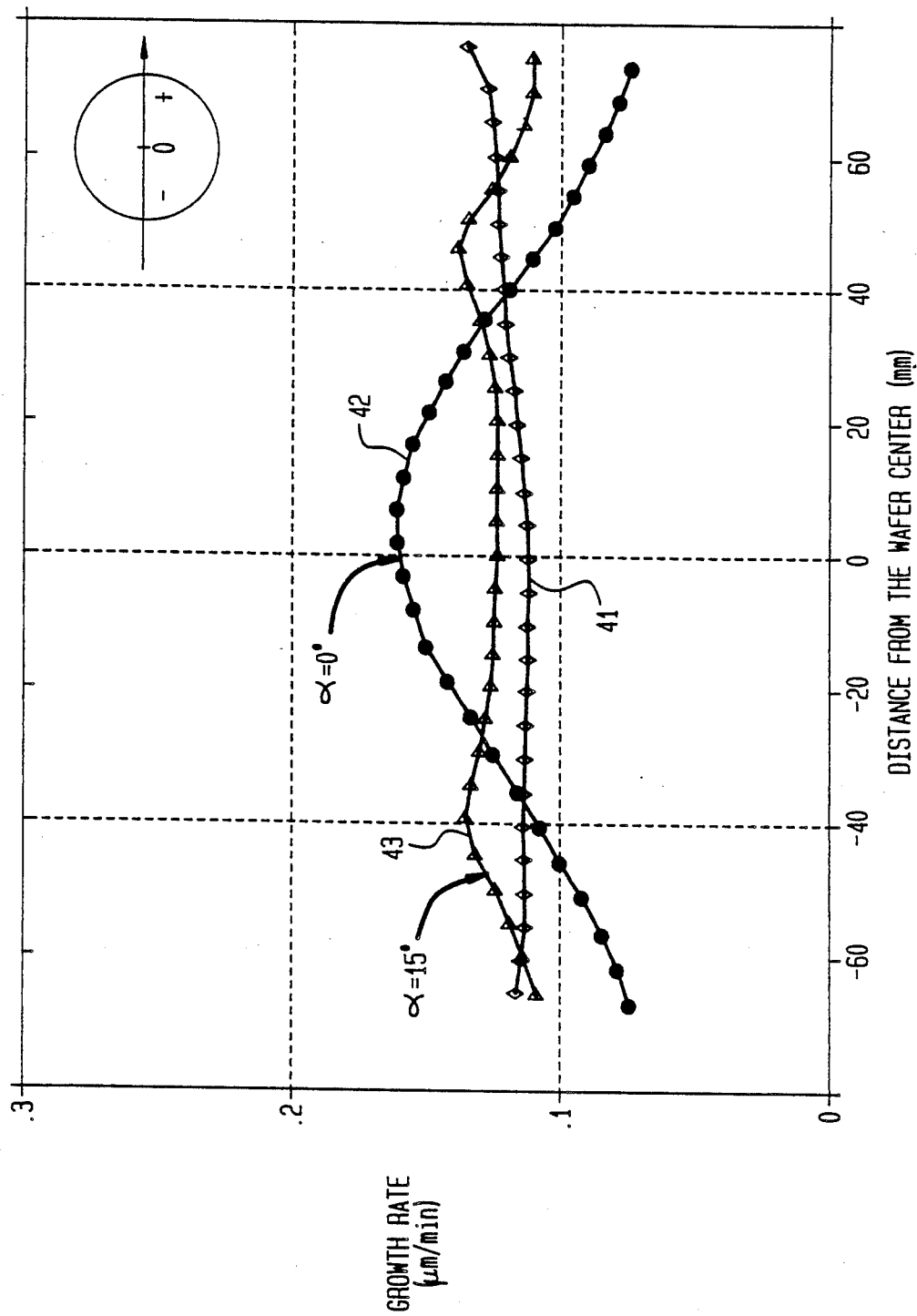
FIG. 4(b) is a diagram showing a relationship between the positions on the Si wafer and the growth rate of the epitaxial layer and for explaining the uniformity of the epitaxial layer in accordance with the first embodiment of the present invention.
Figure 4C:
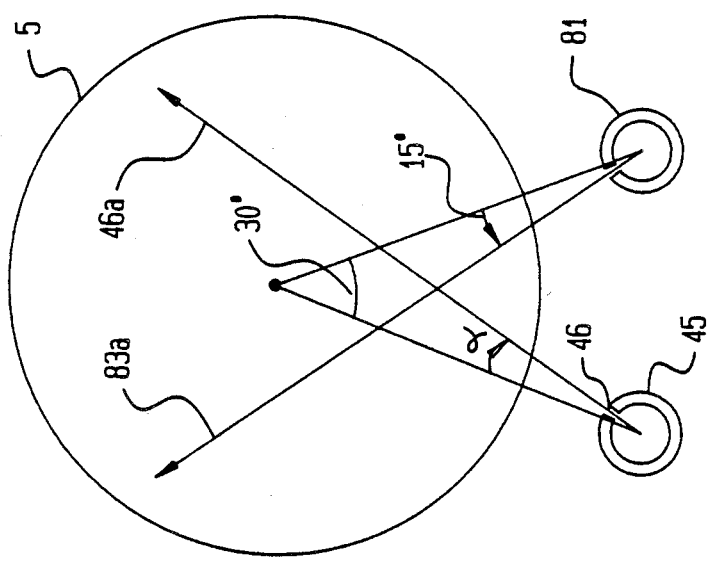
FIG. 4(c) is a sectional view for explaining an arrangement of the nozzle tubes used in obtaining the reference data shown in FIG. 4(b)

Referring now to FIG. 4(a), the epitaxial layer obtained in accordance with the present embodiment shows an excellent unifomity. That is, both the uniformity on a wafer of the growth rate of the epitaxial layer and the uniformity on the wafer of the resistivity of the epitaxial layer were within ±5%. Referring to FIG. 4(b) and FIG. 4(c), uniformity of the growth rate of the epitaxial layer grown in accordance with the present embodiment (see curve 41) is superior to that of the epitaxial layer grown by a gas-supply nozzle tube 45 of one gas-emission holes 46 shown in FIG. 4(c). A curve 42 was obtained by setting the gas-emitting-axis 46a of the gas-emission hole 46 passing just above the center of the Si wafer 5, and a curve 43 was obtained by setting the gas-emitting-axis 46a of the gas-emission hole 46 so as to deviate from the center of the Si wafer 5 toward its right-hand side, the angle between this gas-emitting-axis 46a and the line connecting both the centers of the Si wafer 5 and the nozzle tube 45 being 15°, the gas-emitting-axis 83a being deviated from the center of the Si wafer 5 toward its left-hand side, the angle of the gas-emitting-axis 83a and the line connecting both the centers of the Si wafer 5 and the nozzle tube 81 being 15°. In the process for obtaining these curves 42 and 43, $H_2$ is introduced by the nozzle tube 81 at a flow rate of 20 l/min together with Ar, $SiH_2Cl_2$, HCl and $PH_3$ introduced through the nozzle tube 45 at flow rates of 12 l/min, 400 cc/min, 300 cc/min and 50 cc/min, respectively.

Figure 5:
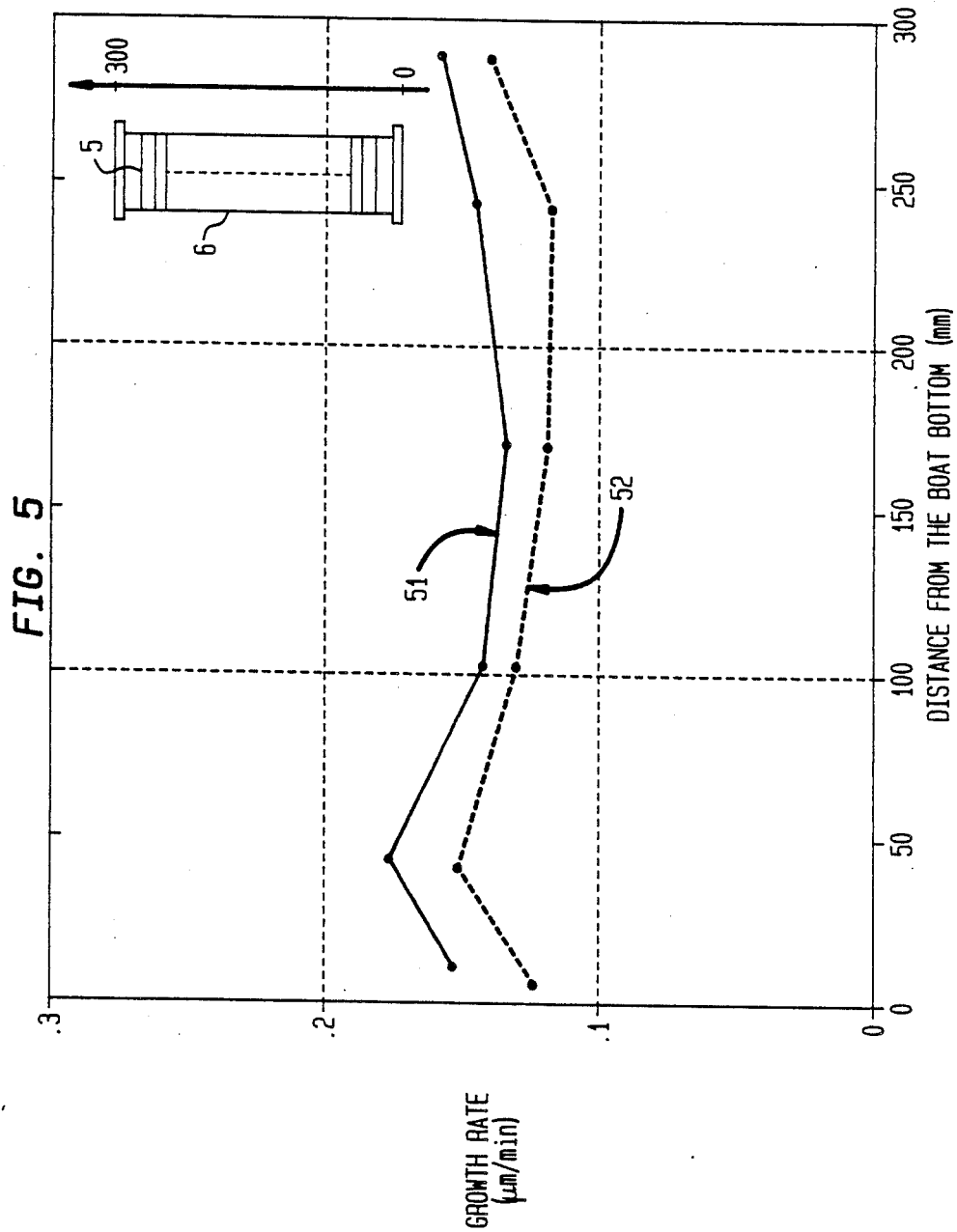
FIG. 5 is a diagram showing a relationship between the positions of the Si wafer in the wafer holder and the growth rate of the epitaxial layer.

Referring to FIG. 5 and FIG. 6, wafer-to-wafer uniformity of the growth rate of the epitaxial layer grown in accordance with the present embodiment (see curve 51) is excellent and superior to that of the epitaxial layer (see curve 52) grown by using the gas-supply nozzle tube 61 shown in FIG. 6 in place of the nozzle tube 9 shown in FIGS. 1 and 3. The nozzle tube 61 has no branch nozzle tube such as the branch nozzle tube 92 of the nozzle tube 9 so as to introduce starting-gases only from the bottom end of the nozzle tube 61.

Referring now to FIG. 7, when $H_2$ is used as a carrier gas in place of Ar, uniformity on a wafer of the resistivity of the epitaxial layer is deteriorated to have ±150%. Since mass and viscosity of hydrogen are smaller than those of Ar, $PH_3$ is not sufficiently transported by $H_2$ carrier gas. Moreover, when $H_2$ is used as a carrier gas, stagnant layer above the Si wafer 5 is thin to consume $PH_3$ at the peripheral of the Si wafer 5. Therefore, the resistivity of the epitaxial layer becomes small at the peripheral of the Si wafer and large at the center of the Si wafer, resulting in large variation of the resistivity of the epitaxial layer.

Second Embodiment

Figure 8:
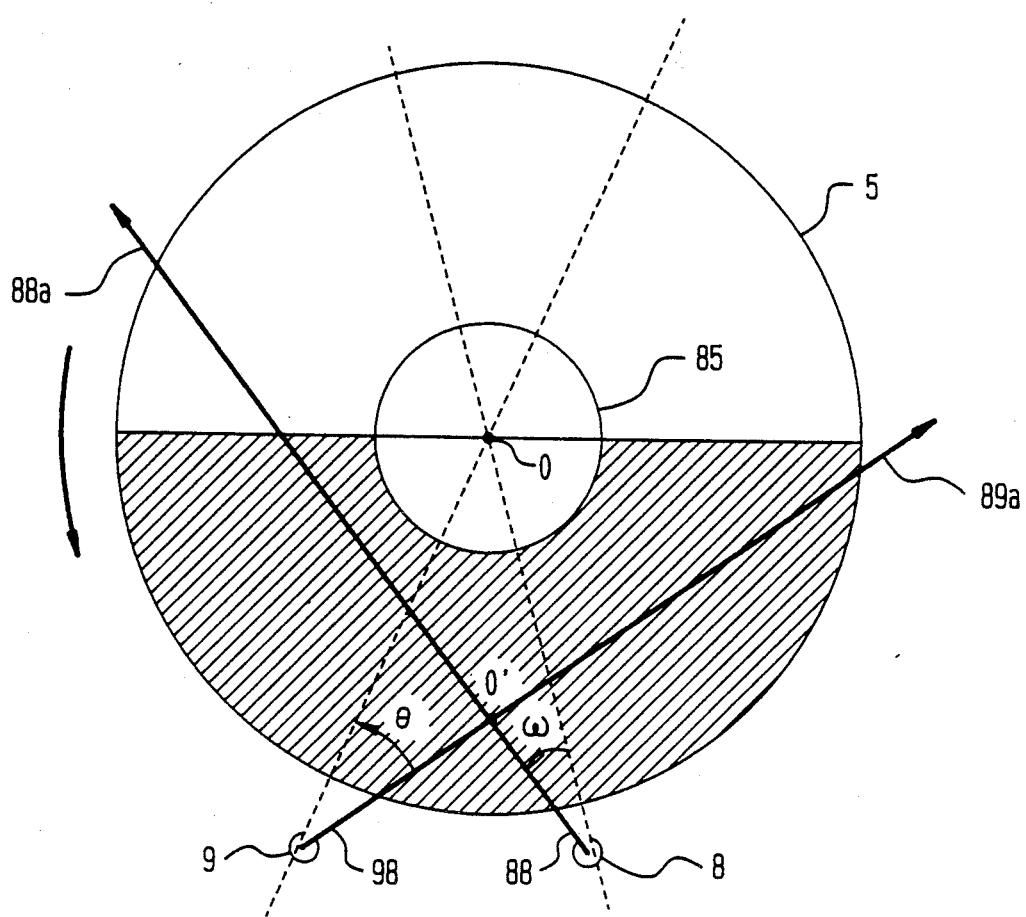
FIG. 8 is a sectional view for explaining a second embodiment of the present invention.

Referring to FIG. 8, Si wafer 5 is installed to be rotated, as a rotation center coincident with the center O of the Si wafer 5. Near the Si wafer 5, two gas-supply nozzle tubes 8 and 9 are installed perpendicularly to the main surface of the Si wafer 5. A gas-emitting-axis 88a of starting-gases emitted from the gas-emission hole 88 formed in the nozzle tube 8 is tilted from the center O of the Si wafer 5 at an angle of $\omega$, a gas-emitting-axis 89a of starting-gases emitted from a gas-emission hole 98 formed in the nozzle tube 9 being tilted from the center O of the Si wafer 5 at an angle of $\theta$.

The angles $\omega$ and $\theta$ are set not to be 0° and the intersection point O' of the two gas-emitting-axes 88a and 89a does not coincide with the center O of the Si wafer 5. The angles $\omega$ and $\theta$ need to be changed according to the size of the Si wafer 5 and the installation positions of the nozzle tubes 8 and 9. When the flow of the starting-gases supplied from the nozzle tubes 8 and 9 are concentrated on the neighborhood of the center of the Si wafers 5, the film thickness at the center of the Si wafer 5 becomes thick, while the film thickness at the periphery of the Si wafer 5 becomes thin. Therefore, the intersection point O' is favorably positioned above the hatched region of the Si wafer 5 which is inside the semicircle of the Si wafer 5 on the nozzle-tube side and outside a concentric circle 85 having a radius $\gamma$ which is 30% of a radius R of the Si wafer 5.

The Si wafer 5 having a diameter of 150 mm and the nozzle tubes 8 and 9 are installed in the CVD apparatus as shown in FIG. 1. Referring to FIG. 1 again, the Si wafer 5 is held horizontally in the wafer holder 6. Rotating the wafer holder at 5 rpm, the temperature is elevated to 1100° C $SiH_2Cl_2$, $H_2$ and $PH_3$ (diluted with $H_2$) are introduced by the nozzle tube 8 and 9 with the flow rates of 300 cc/min, 25 l/min and 20 cc/min, respectively. Under the pressure of 10 Torr, n-type Si epitaxial layers are grown to have a thickness of 10 $\mu$m.

Figure 9A:
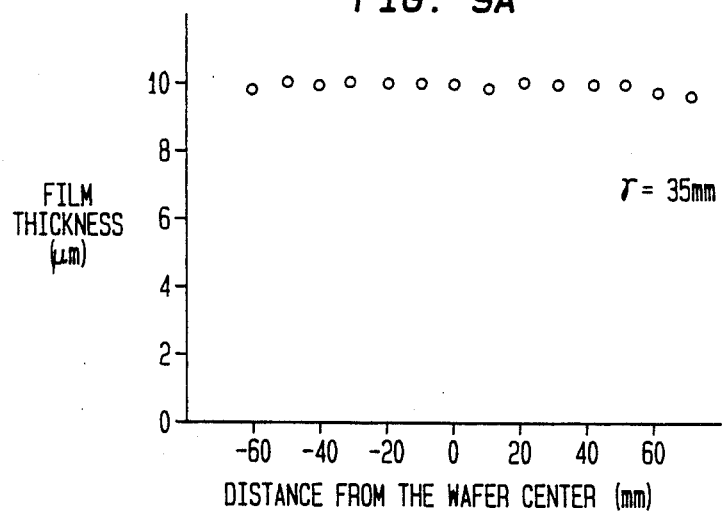
FIGS. 9(a), 9(b) and 9(c) are diagrams showing relationships between the positions on the Si wafer and the film thickness of the epitaxial layers in accordance with the second embodiment of the present invention.
Figure 9B:
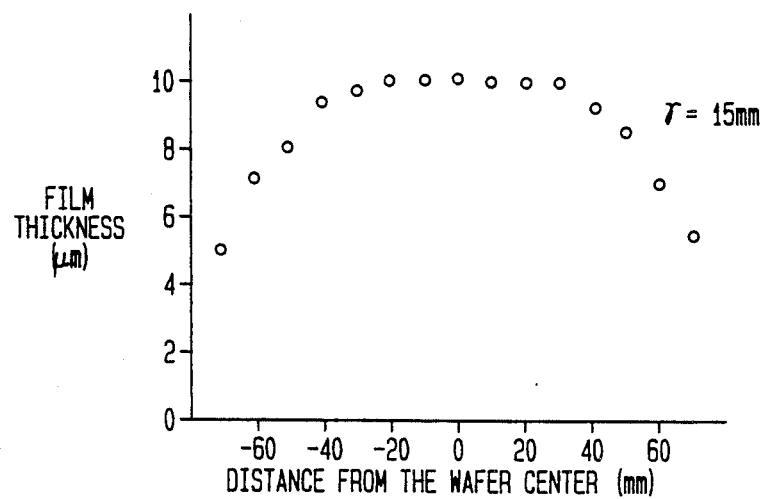
Figure 9C:
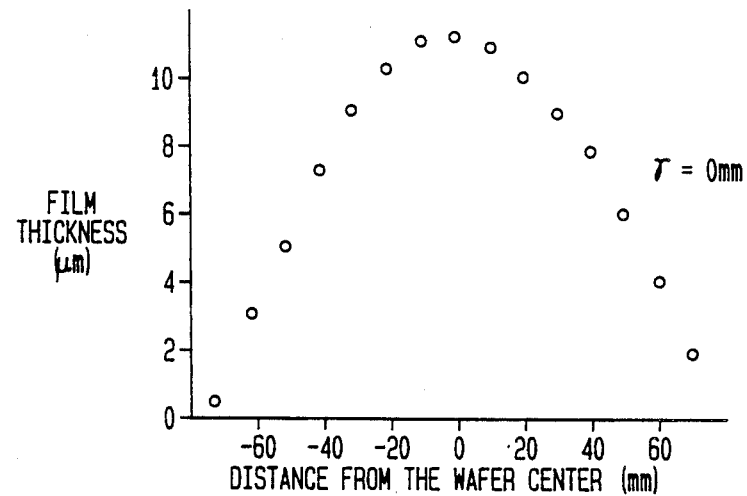

In FIGS. 9(a), 9(b) and 9(c), there is shown the relationships between the positions on the Si wafer 5 and the film thickness of the epitaxial layers when the intersection point O' of the two gas-emitting-axis 8a and 9a is respectively positioned between the line connecting the center of the Si wafer 5 and the center of the nozzle tube 8 and the line connecting the center of the Si wafer and the center of the nozzle tube 9 and on the circle 85 having a radius $\gamma$ of 0 mm (i.e. just above the center of the Si wafer 5), 15 mm and 35 mm.

Figure 10:
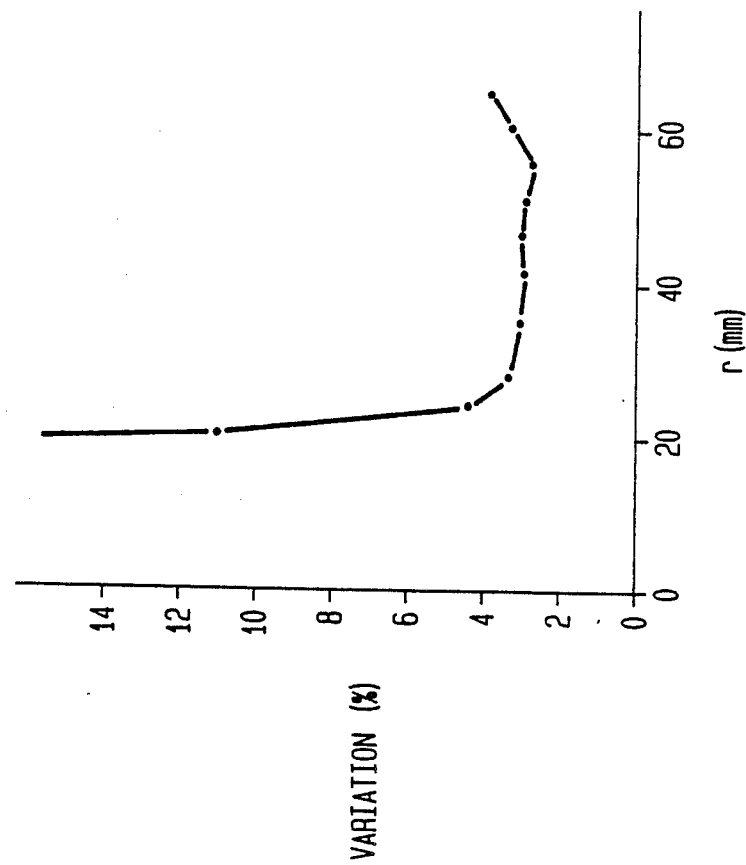
FIG. 10 is a diagram showing a relationship between the positions of the intersections of the gas-emitting-axes from the nozzle tubes and the deviation of the film thickness of the epitaxial layers.

When the radius $\gamma$ of the circle 85 is 0 mm, the epitaxial growth at the periphery of the Si wafer is scarcely observed. When $\gamma$ is 15 mm, the film thickness in the center portion of 60~70 mm in diameter is uniformly thick, but that in the periphery is thin. When $\gamma$ is 35 mm, Si epitaxial layer is grown on the whole surface of the Si substrate 5 with uniform film thickness, the uniformity of the thickness being within 3%. Moreover, when $\gamma$ is 35 mm, the uniformity of the resistivity of the epitaxial layer is within 5% over the entire surface of the Si substrate 5. In FIG. 10, the relationship between the radius $\gamma$ of the circle 85 and the variation of the film thickness of the epitaxial layer over the entire surface of the Si substrate 5 is shown. When $\gamma$ is less than 25 mm, the variation of the film thickness increases abruptly. Moreover, when $\gamma$ is less than 22.5 mm (which corresponds to 30% of the radius R of the Si wafer 5 of 150 mm in diameter), the variation of the film thickness is so large that the epitaxial film cannot be practically used in an IC production. When the epitaxial layer is grown by setting the intersection point O' in the hatched region in FIG. 8, uniformity of the film thickness and the resistivity of the epitaxial layer is similar to the aformentioned results.

Third Embodiment

Figure 11:
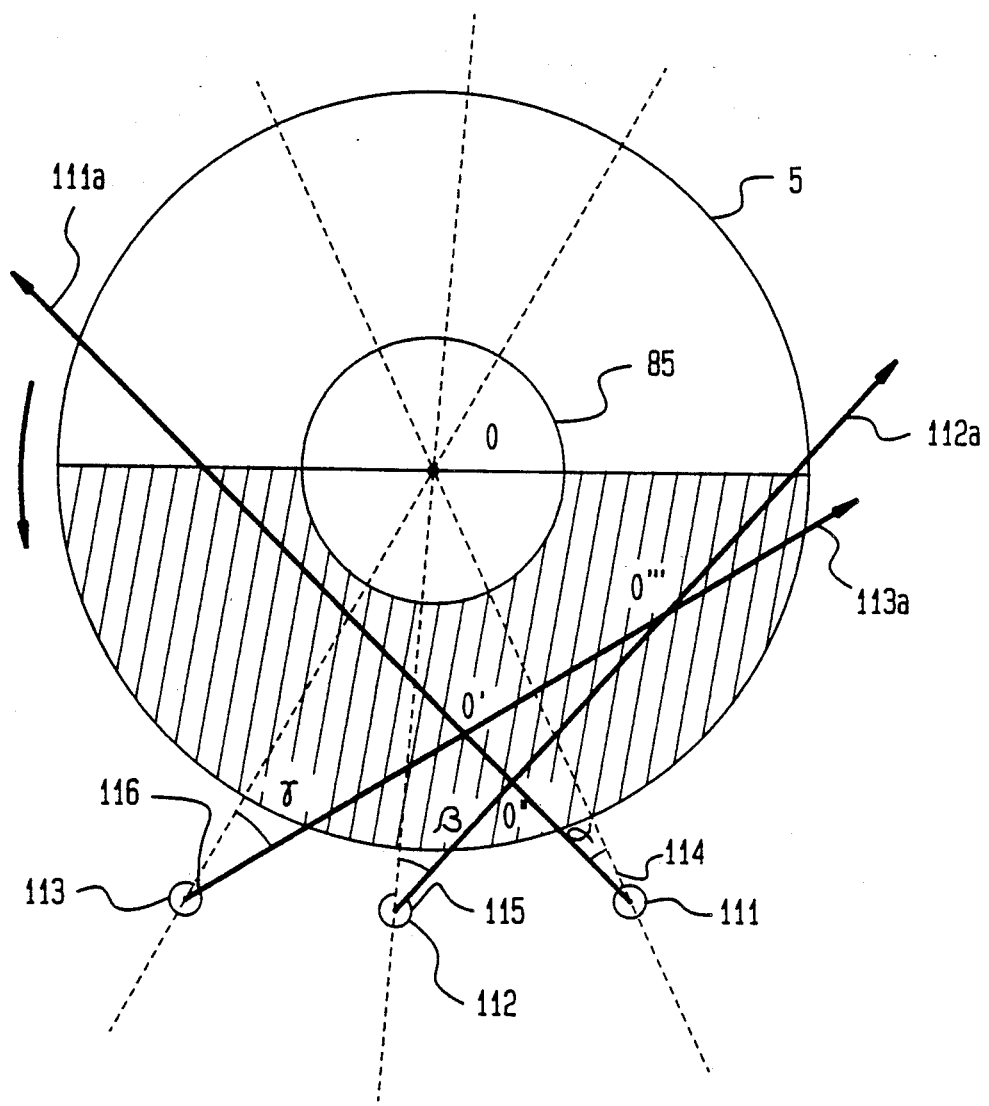
FIG. 11 is a sectional view for explaining a third embodiment of the present invention.

Referring to FIG. 11, Si wafer 5 is installed to rotate around its center O. Near the Si wafer 5, three gas-supply nozzle tubes 111, 112 and 113 are installed perpendicularly to the main surface of the Si wafer 5. A gas-emitting-axis 111a of starting-gases emitted from a gas-emission hole 114 formed in the nozzle tube 111 is tilted from the center O of the Si wafer 5 at an angle $\alpha$, a gas-emitting-azis 112a of starting-gases emitted from a gas-emission hole 115 formed in the nozzle tube 112 being tilted from the center O of the Si wafer 5 at an angle $\beta$, a gas-emitting-axis 113a of starting-gases emitted from a gas-emission hole 116 formed in the nozzle tube 113 being tilted from the center O of the Si wafer 5 at an angle $\gamma$.

The angles $\alpha$, $\beta$ and $\gamma$ are set not to be 0° and the intersection points O', O" and O''' do not coincide with the center O of the Si wafer 5. The angles $\alpha$, $\beta$ and $\gamma$ are changed according to the size of the Si wafer 5 and the installation positions of the nozzle tubes 111, 112 and 113, the intersection points O', O" and O''' being favorably positioned above the hatched region of the Si wafer 5 which is inside the semicircle of the Si wafer 5 on the nozzle-tube side and outside the concentric circle 85 having a radius $\gamma'$ which is 30% of a radius R' of the Si wafer 5 as the second embodiment.

The Si wafer 5 having a diameter of 200 mm and the nozzle tubes 111, 112 and 113 are installed in the CVD apparatus shown in FIG. 1. Referring to FIG. 1 again, the Si wafer 5 is held horizontally in the wafer holder 6. Rotating the wafer holder at 8 rpm, the wafer 5 is heated to 1100° C $SiH_2Cl_2$, $H_2$ and $B_2H_6$ (diluted with $H_2$) are introduced through the nozzle tubes 111, 112 and 113, the flow rates of $SiH_2Cl_2$, $H_2$ and $B_2H_6$ being 400 cc/min, 30 l/min and 20 cc/min, respectively. Under the pressure of 10 Torr, P-type Si epitaxial layers of 5 μm in thickness are grown. In this embodiment, the intersection points O', O'' and O''' coincide with one another and are positioned between the line connecting the center of the Si wafer 5 and the center of the nozzle tube 111 and the line connecting the center of the Si wafer 5 and the center of the nozzle tube 113 and on the circle 85 having a radius $\gamma'$.

Figure 12A:
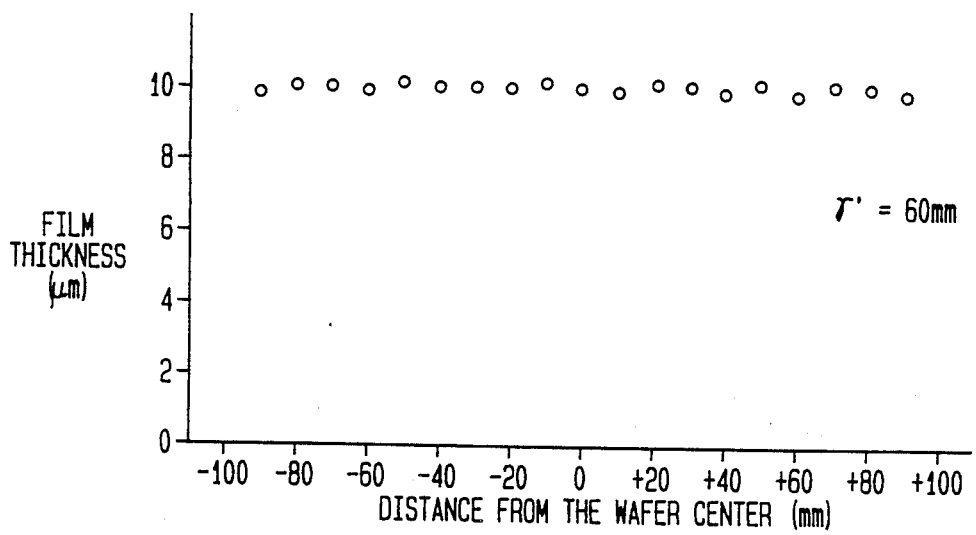
FIGS. 12(a), 12(b) and 12(c) are diagrams showing relationships between the positions on the Si wafers and the film thickness of the epitaxial layers in accordance with the third embodiment of the present invention.
Figure 12B:
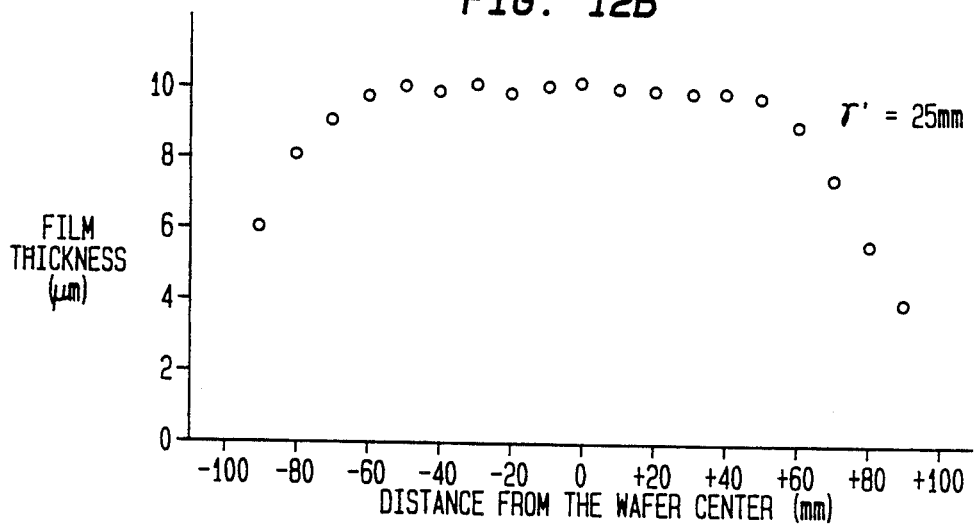
Figure 12C:
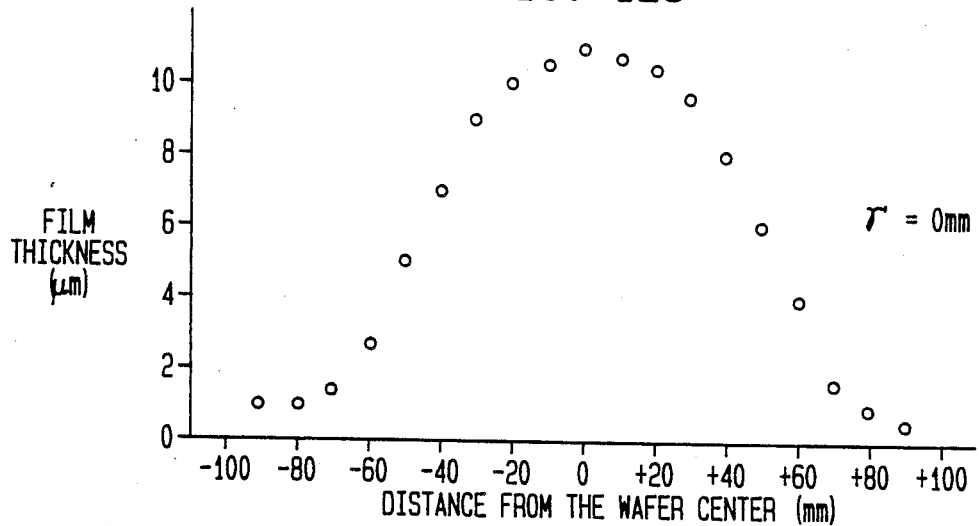

In FIGS. 12(a), 12(b) and 12(c), the relationships between the positions on the Si wafer 5 and the film thickness of the epitaxial layers when $\gamma'$ is 0 mm, 25 mm and 65 mm are shown. When $\gamma'$ is 0 mm, the film thickness only at the center portion of the Si wafer 5 is thick. When $\gamma'$ is 25 mm, the center portion is flat but the film thickness at the periphery is thin. When $\gamma'$ is 60 mm, uniform film thickness is obtained, its uniformity being within ±3%.

In this embodiment, since the number of the nozzle tubes is three, good uniformity of the film thickness can be obtained on the Si wafer having a larger diameter of more than 200 mm.

Fourth Embodiment

Figure 13:
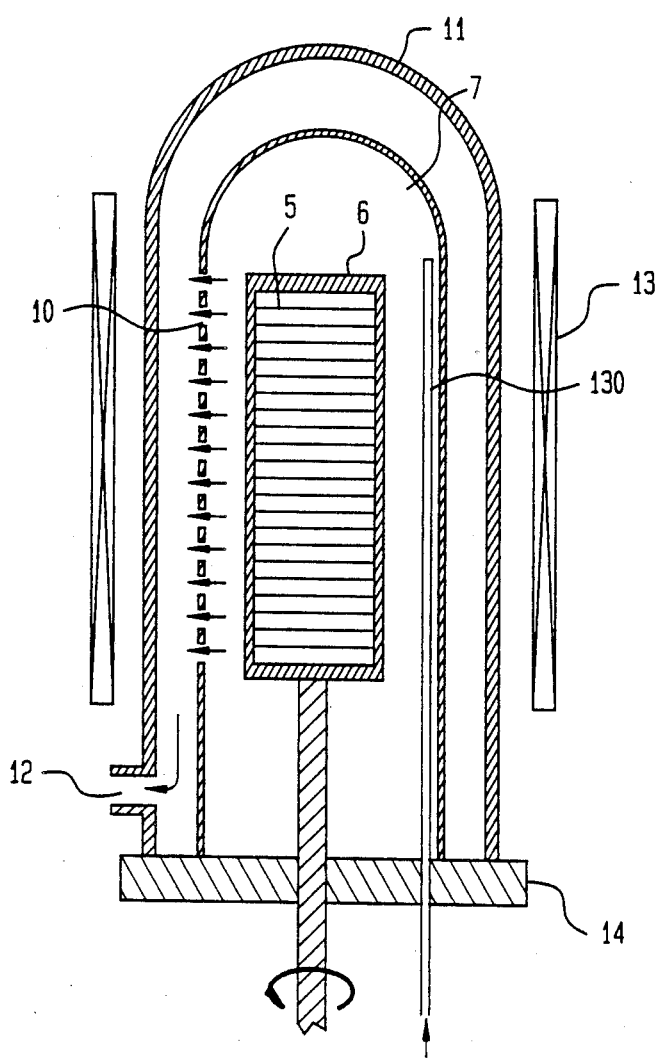
FIG. 13 is a sectional view showing a CVD apparatus in accordance with the fourth embodiment of the present invention.

Referring now to FIG. 13, an outer reaction tube 11 and an inner reaction tube 7 are installed on a pedestal 14. A wafer holder 6 for holding the Si wafers 5 is installed in the inner reaction tube 7. A gas-supply nozzle tube 130 is installed vertically near the wafer holder 6. Starting-gases are introduced through the nozzle tube 130 over the Si wafers 5 and exhaused through holes 10 formed in the wall of the inner reaction tube 7 and through a vent 12 formed in the outer reaction tube 11. The Si wafers 5 are heated by the furnace 13.

Figure 14A:
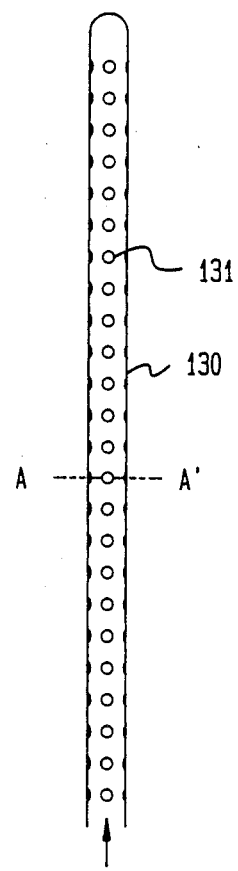
FIG. 14(a) is a front view showing a nozzle tube used in the fourth embodiment of the present invention.
Figure 14B:
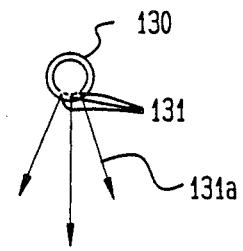
FIG. 14(b) is a sectional view along A—A' line of the nozzle tube shown in FIG. 14(a)

Referring to FIGS. 14(a) and 14(b), many gas-emission holes 131 are formed in the nozzle tube 130. Since the holes 131 are aligned in three columns, starting-gases emitted from the nozzle tube 130 spread in a radial manner over a wide area of the Si wafer 5. Therefore, uniform film thickness over the entire Si wafer 5 having a large diameter can be obtained.

Referring to FIG. 13, 100 Si wafers 5 having a diameter of 150 mm are set in the wafer holder 6, the space between the adjacent Si wafers 5 being 8 mm. Rotating the wafer holder 6 at 5 rpm, the temperature inside the inner reaction tube 7 is elevated to 1050° C by the furnace 13. Through the nozzle tube 130, $H_2$, $SiH_2Cl_2$ and $PH_3$ are introduced into the inner reaction tube 7. The flow rate $H_2$ is 20 l/min, $SiH_2Cl_2$, 200 ml/min and $PH_3$, 2 ml/min. N-type Si epitaxial layers are grown on the installed wafers 5 under a pressure of 5 Torr.

Figure 15:
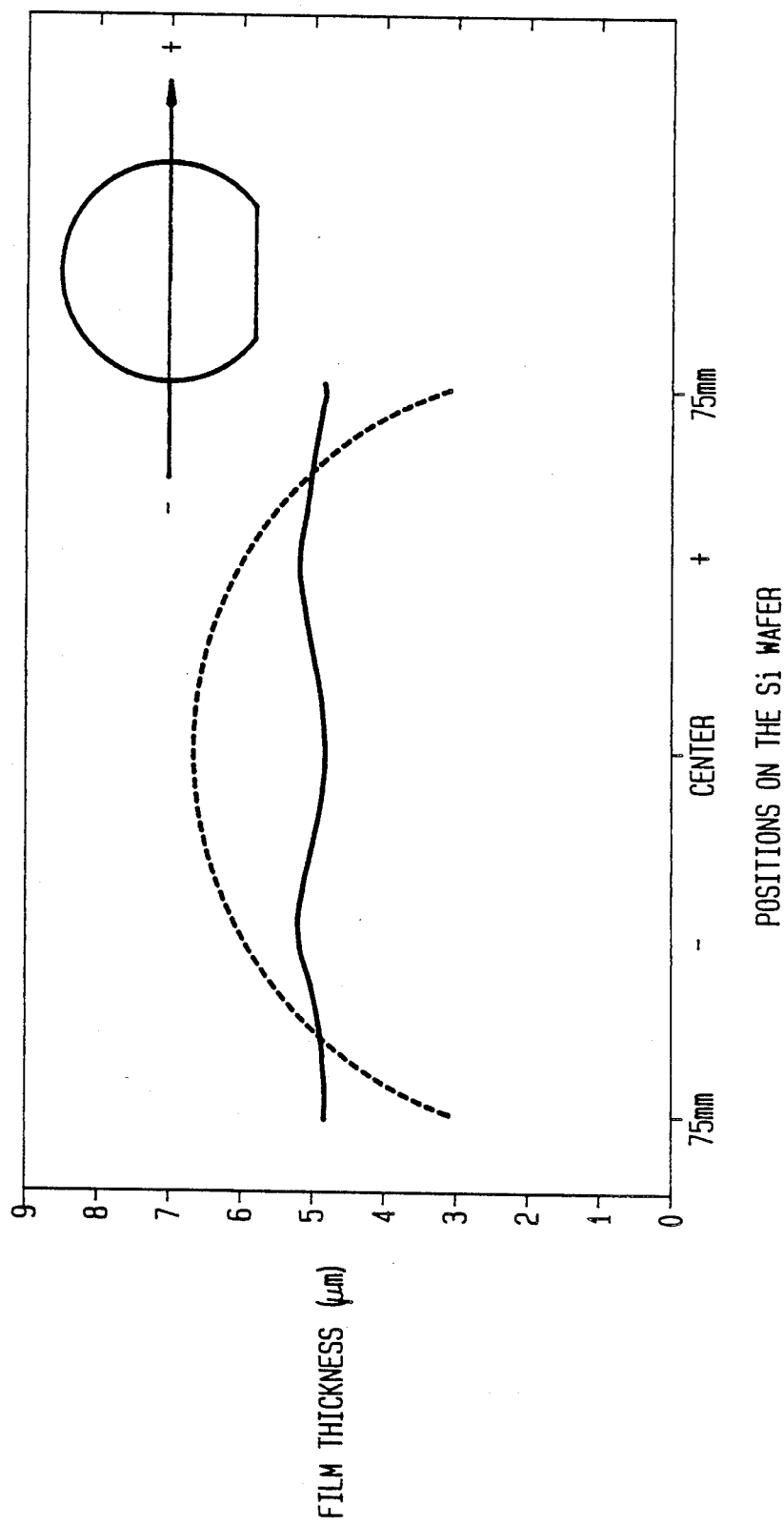
FIG. 15 is a diagram showing a relationship between the positions on the Si wafer and the film thickness of the epitaxial layer in accordance with the fourth embodiment of the present invention.

In FIG. 15, a relationship between the positions on the Si wafer 5 and the film thickness of the epitaxial layer according to the present embodiment (shown by a solid line) along with that of the epitaxial layer grown by the nozzle tube 130' shown in FIGS. 16(a) and 16(b) having gas-emission holes 131' in one column in place of the nozzle tube 130 (shown by a broken line). These data were obtained by measuring the film thickness along the arrow line which is shown in the upper part of this FIG. 15 so as to pass over the center of the Si wafer. In a case of using the nozzle tube 130' shown in FIGS. 16(a) and 16(b), the uniformity of the film thickness is ±5% within the center portion of 60 mm in diameter and ±40% over the whole surface of the Si wafer 5. However, uniformity of the film thickness according to the present embodiment is remarkably improved to show the good flatness of ±4% in the film thickness over the whole surface of the Si wafer 5. Moreover, the uniformity of the resistivity of the epitaxial layer is about 3% over the whole surface of the Si wafer 5.

Fifth Embodiments

Figure 17C:
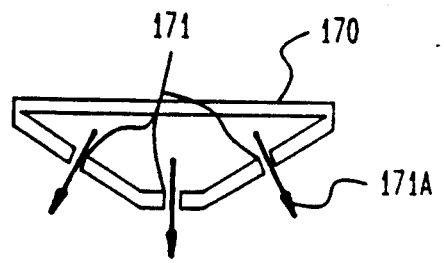
FIG. 17(c) is a sectional view of the nozzle tube shown in FIG. 17(b)
Figure 17A:
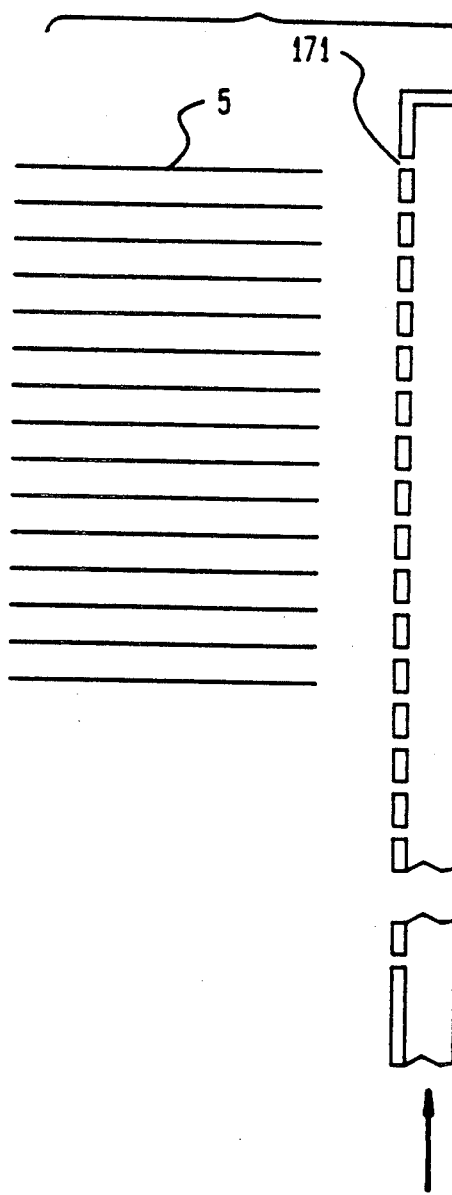
FIG. 17(a) is a sectional view for explaining the fifth embodiment of the present invention.
Figure 17B:
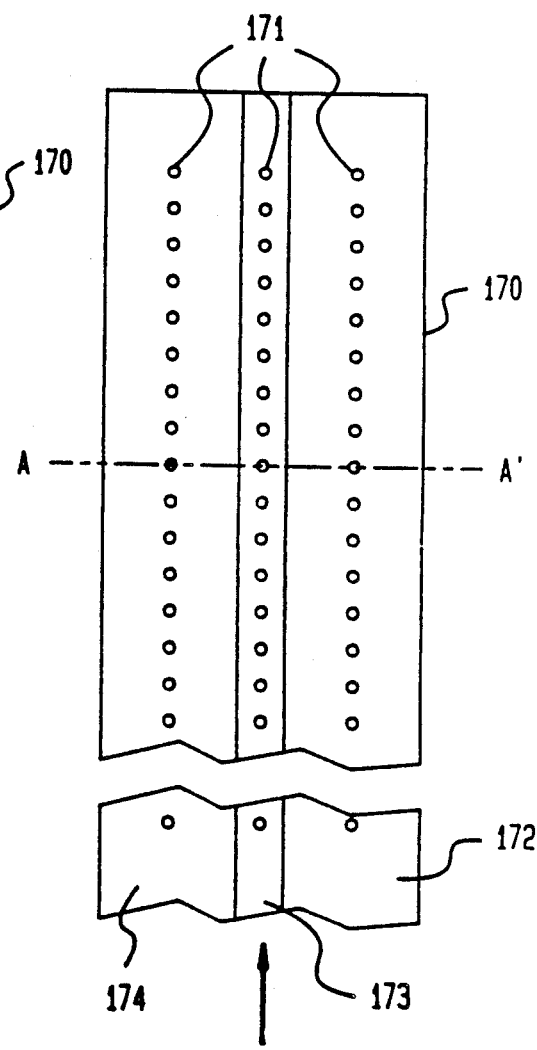
FIG. 17(b) is a front view of the nozzle tube used in the fifth embodiment of the present invention.

Referring to FIGS. 17(a), 17(b) and 17(c), a nozzle tube 170 has three gas-supply planes 172, 173 and 174 facing the Si wafers 5. In each plane, the gas-supply holes 171 are formed in one column. Therefore, gas-emitting-axes 171a are spread in a radial manner above the Si wafer 5.

Si epitaxial layers are grown on the Si wafers 5 of 150 mm in diameter by the nozzle tube 170 shown in FIGS. 17(a), 17(b) and 17(c), which is employed in the CVD apparatus shown in FIG. 13 in place of the nozzle tube 130 in the same growth condition as in the fourth embodiment. The uniformity of the film thickness on-the-wafer is ±4%, resulting in the same uniformity as the fourth embodiment.

Sixth Embodiment

Referring to FIG. 18, a nozzle tube 180 has a gas-emission tube 182 in which a plurality of gas-emission holes 181 are formed and a gas-inlet tube 183. The top end of the gas-inlet tube 183 is connected to the center portion of the gas-emission tube 182. The starting-gases are to be supplied from the bottom end of the gas-inlet tube 183. Since the starting-gases are supplied into the center portion of the gas-emission tube 182, uniform flow rates of the starting-gases emitted from the gas-emission holes 181 are obtained regardless of the positions of the gas-emission holes 181 in the gas-emission tube 182, resulting in the excellent wafer-to-wafer uniformity.

Referring to FIG. 13 again, the nozzle tube 180 of FIG. 18 is installed in the inner reaction tube 7 in place of the nozzle tube 130. 100 Si wafers 5 of 150 mm in diameter are set in the wafer holder 6 with a spacing of 5 mm between adjacent Si wafers 5. Rotating the wafer holder 6 at 5 rpm, the temperature inside the inner reaction tube 7 is elevated to 1050° C by the furnace 13. Through the nozzle tube 180, $H_2$, $SiH_2cl_2$ and $PH_3$ are introduced into the inner reaction tube 7 with flow rates of 20 l/min of $H_2$, 200 ml/min of $SiH_2Cl_2$ and 2 ml/min of $PH_3$ to grow N-type Si epitaxial layers of 5 μm in thickness under a pressure of 5 Torr.

In FIG. 19, a relationship between the setting-positions of the Si wafers 5 in the wafer holder 6 and the film thickness of the grown epitaxial layer according to the present embodiment (shown by a solid line) along with that of the epitaxial layer grown by the nozzle tube 130' shown in FIGS. 16(a) and 16(b) in which starting-gases are supplied only through the bottom end of the nozzle tube 130' (shown by a broken line). In a case of using the nozzle tube 130' shown in FIGS. 16(a) and 16(b), a good wafer-to-wafer uniformity of the film thickness is obtained for 50 Si wafers 5 set in the lower side of the wafer holder 6, but the film thickness decreases gradually as the setting position of the Si wafer 5 becomes close to the upper side, resulting in deteriorated wafer-to-wafer uniformity. However, the wafer-to-wafer uniformity of the film thickness according to the present invention is remarkably improved to show the wafer-to-wafer uniformity of 5 % in the film thickness over the whole wafers 5 in the wafer holder 6. The wafer-to-wafer uniformity of the resistivity is also improved in the same manner as the film thickness.

Next, P-type Si epitaxial films are grown by introducing $H_2$, $SiH_2Cl_2$ and $B_2H_6$ as starting gases with flow rate of 20 l/min of $H_2$, 200 ml/min of $SiH_2Cl_2$ and 2 ml/min of $B_2H_6$. Epitaxial layerts with excellent wafer-to-wafer uniformity can be grown also in this case.

Seventh Embodiment

Referring to FIG. 20, a gas-supply nozzle tube 200 has a main gas-supply nozzle tube 202 in which a plurality of gas-emission holes 201 are formed in a line, a branch gas-supply nozzle tube 203 of which the top and bottom ends are respectively connected to the top and bottom ends of the main gas-supply nozzle tube 202 and a gas-inlet nozzle tube 204. The top end of the gas-inlet nozzle tube 204 is connected to the center portion of the branch gas-supply nozzle tube 203 so as to supply starting-gases from the bottom end of the gas-inlet tube 204. Since the starting-gases are supplied to both the top and bottom ends of the main gas-supply nozzle tube 202 through the branch nozzle tube 203, the flow rate of the starting-gas mixture emitted from the gas-emission holes 201 is equalized regardless of positions of the gas-emission holes 201 in the main gas-supply nozzle tube 202, resulting in the good wafer-to-wafer uniformity of grown epitaxial layers.

Referring back to FIG. 13, the nozzle tube 200 of FIG. 20 is installed in the inner reaction tube 7 in place of the nozzle tube 130. 100 Si wafers 5 of 150 mm in diameter are set in the wafer holder 6 with a spacing of 8 mm between the adjacent Si wafers 5. Rotating the wafer holder 6 at 5 rpm, the temperature inside the inner reaction tube 7 is elevated to 1050° C by the furnace 13. Through the nozzle tube 200, $H_2$, $SiH_2Cl_2$ and $PH_3$ are introduced with flow rate of 20 l/min, 200 ml/min and 2 ml/min to grow N-type Si epitaxial layers of 5 μm in thickness under a pressure of 5 Torr.

Figure 21:
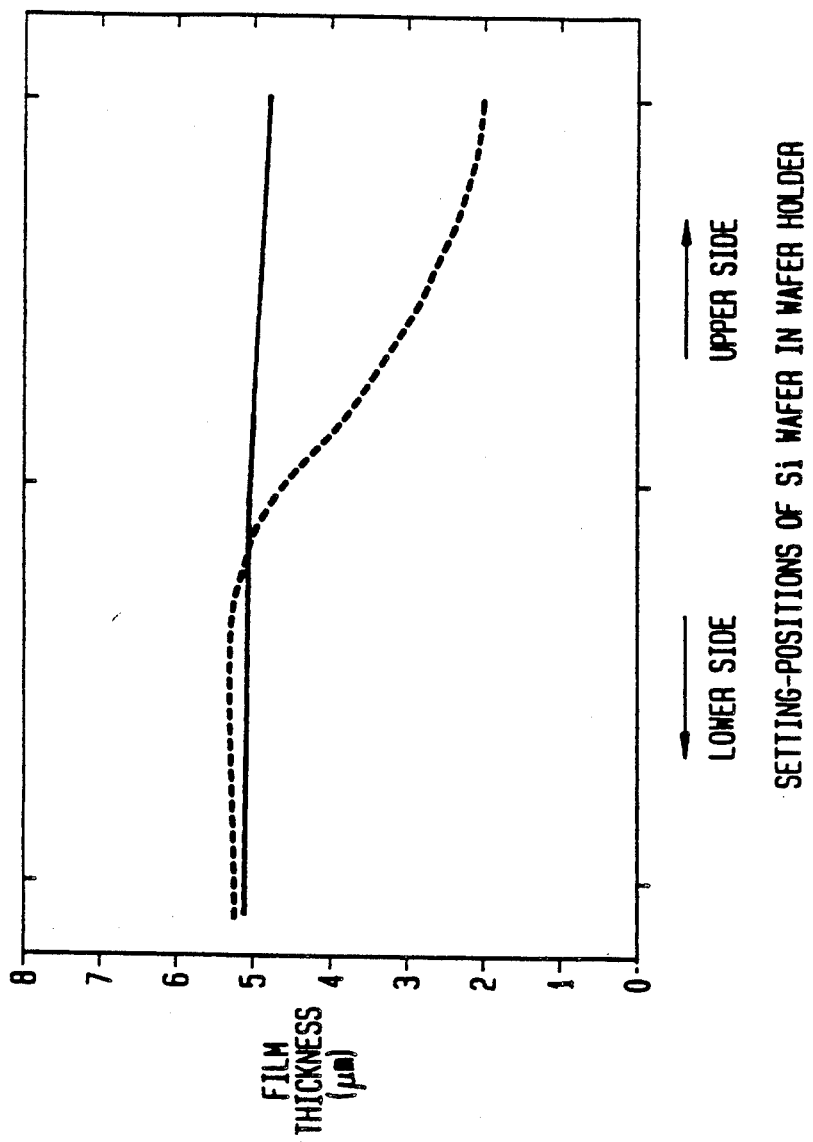
FIG. 21 is a diagram showing a relationship between the positions of the Si wafers and the film thickness of the epitaxial layers in accordance with the seventh embodiment of the present invention.

In FIG. 21, a relationship between the setting-positions of the Si wafers 5 in the wafer holder 6 and the film thickness of the epitaxial layer grown in accordance with the present embodiment (shown by a solid line) along with that of the epitaxial layer grown by the nozzle tube 130′ shown in FIGS. 16(a) and 16(b) through which starting gases are supplied (shown by a broken line). In a case of using the nozzle tube 130′ shown in FIGS. 16(a) and 16(b), a good wafer-to-wafer uniformity of the film thickness is obtained for 50 Si wafers 5 set in the lower side of the wafer holder 6, but the film thickness decreases gradually toward the upper side wafer, resulting in a deteriorated wafer-to-wafer uniformity. However, the wafer-to-wafer uniformity of the film thickness grown in accordance with the present invention is remarkably improved to show the wafer-to-wafer uniformity of 5%. The wafer-to-wafer uniformity of the resistivity is also improved in the same manner as the film thickness.

Next, P-type Si epitaxial films are grown by introducing $H_2$, $SiH_2Cl_2$ and $B_2H_6$ as starting-gases with flow rates of 20 l/min, 200 ml/min and 2 ml/min under the same growth condition as that in the case of $PH_3$ except for the starting-gas of $B_2H_6$. Epitaxial layers having good wafer-to-wafer uniformity can also be grown.

Eighth Embodiment

Figure 22:
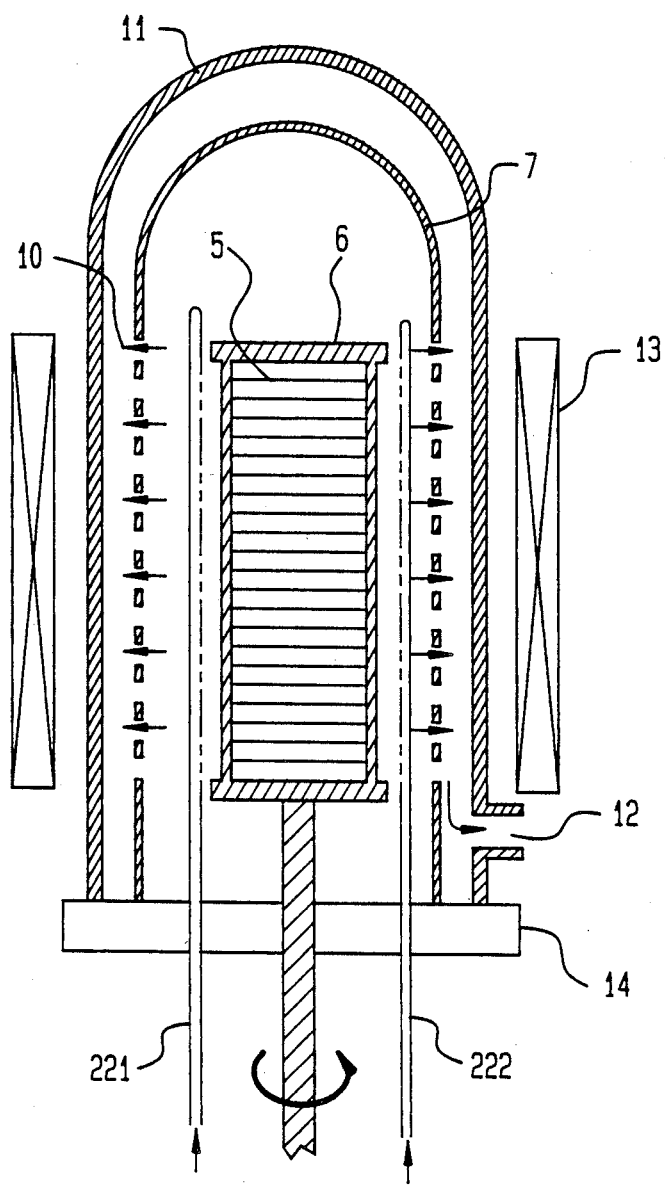
FIG. 22 is a sectional view showing a CVD apparatus used in the eighth embodiment of the present invention.

Referring now to FIG. 22, an outer reaction tube 11 having a vent 12 is installed on a pedestal 14. An inner reaction tube 7 having holes 10 for exhausting reaction gases is installed in the outer reaction tube 11 and on the pedestal 14. A wafer holder 6 holding Si wafers 5 in a stack-like fashion is installed rotatably in the inner reaction tube 7. Gas-supply nozzle tubes 221 and 222 are installed vertically near the wafer holder 6, the gas-supply nozzle tubes respectively having the same numbers of holes as the Si wafers 5. The Si wafers 5 are heated by the furnace 13.

75 Si wafers 5 having a diameter of 150 mm are set in the wafer holder 6 with a spacing of 8 mm between adjacent Si wafers. Rotating the wafer holder 6 at 10 rpm, $H_2$ is introduced at a flow rate of 25 l/min through the nozzle tube 221, and Ar is at a flow rate of 20 l/min through the nozzle tube 222 at a flow rate of 20 /min. The pressure in the reaction tubes 7 and 11 are kept at 5 Torr. Under this condition, the temperature of the Si wafers is elevated to 1100° C. Then, Si epitaxial layers are grown on the Si wafers 5 by introducing $SiH_2Cl_2$ and $B_2H_6$ through the nozzle tube 222 with flow rates of 600 ml/min and 0.01 ml/min, respectively, while keeping the pressure in the reaction tube 7 and 11 at 5 Torr.

Epitaxial films of 5 μm in film thickness are grown on all the 75 Si wafers 5. The uniformity of the film thickness was within ±4% and the uniformity of the resistivity was ±6%. When $H_2$ is introduced through the nozzle tube 222 at the flow rate of 20 l/min as a carrier gas in place of the Ar carrier gas, the uniformity of the film thickness of the eiptaxial films is deteriorated to about ±12% and the variation of the resistivity of the epitaxial layer is increased to about 20%. To obtain the same uniformity of the film thickness and the resistivity as the Ar carrier gas, the flow rate of the $H_2$ carrier gas is required to be more than 120 l/min.

Next, using the same CVD apparatus shown in FIG. 22, N-type epitaxial layers are grown as another example of the present embodiment. Rotating 75 Si wafers 5 having a diameter of 150 mm at 10 rpm, $H_2$ is introduced at a flow rate of 35 l/min through the nozzle tube 221 and Kr is introduced as a carrier gas of $SiHCl_3$ through the nozzle tube 222 at a flow rate 18 l/min, while the pressure in the reaction tubes 7 and 11 are kept at 8 Torr. Under this condition, the temperature of the Si wafers is elevated to 1150° C. Then, Si epitaxial layers are grown on the Si wafers 5 by further introducing $SiHCl_3$ and $PH_3$ through the nozzle tube 222 with flow rates of 500 ml/min and 0.02 ml/min, respectively, while keeping the pressure in the reaction tubes 7 and 11 at 8 Torr.

Epitaxial films of 8 μm in thickness are grown on all the 75 Si wafers 5. The uniformity of the grown film thickness was within ±5% and the uniformity of there resistivity was within ±7%. When $H_2$ is introduced as a carrier gas through the nozzle tube 222 at the flow rate of 25 ml/min in place of Ar, the uniformity of the film thickness of the epitaxial layers is deteriorated to about 15% and the variation of the resistivity of the epitaxial layer increases to about ±20%. In order to obtain the same uniformity of the film thickness and the resistivity of the epitaxial layers as in the case of using Ar carrier gas, the flow rate of the $H_2$ carrier gas is required to be more than 180 l/min.

In this example, since Kr having a larger atomic weight than Ar is used as a carrier gas of $SiHCl_3$ having a larger molecular weight than $SiH_2Cl_2$, the quantity of the carrier gas necessary to obtain uniform epitaxial layers can be reduced. Additionally, in the first example of the present embodiment, when Kr is used in place of Ar introduced with a flow rate of 20 l/min, the reduced flow rate of 12 l/min is enough to obtain the good uniformities in the film thickness and the resistivity.

By using rare gases such as Ar and Kr, maintaining the uniformities of the film thickness and the resistivity, the amount of $H_2$ can be remarkably reduced. Therefore, the apparatus to supply $H_2$ and the apparatus to treat the exhaust gases can be miniaturized to lower the manufacturing-cost.

The foregoing embodiments represent the cases where Si epitaxial layers are grown on the Si wafers, but the CVD apparatus according to the present invention can be used to grow an oxide-film, a nitride-film, a polysilicon film, an amorphous silicon film and other inorganic films. Furthermore, besides the resistance heating method, a RF-induction-heating method and a radiant-heating method may be similarly used to heat the substrates such as Si wafers.

What is claimed is:

1. A chemical vapor deposition apparatus comprising:
    a reaction tube;
    a substrate-holder installed in said reaction tube, said substrate-holder having a means for stacking a plurality of substrates in a vertical direction with a space of a predetermined interval, surfaces of said substrates being held horizontally;
    a rotating-means for rotating said substrates stacked in said substrate-holder;
    a heating-means for heating said substrates;
    a first gas-supply nozzle tube installed vertically in said reaction tube, said first gas-supply nozzle tube having a first vertical gas-emission line, said first vertical gas-emission line having a plurality of first gas-emission holes aligned in a vertical direction; and
    a second gas-supply nozzle tube installed vertically in said reaction tube, said second gas-supply nozzle tube having a second vertical gas-emission line, said second vertical gas-emission line having a plurality of second gas-emission holes aligned in a vertical direction, a first gas-emitting-axis of said first gas-emission holes intersecting with a second gas-emitting-axis of said second gas-emission holes at a first intersection over said substrate, said first intersection of said first and second gas-emitting axes being deviated from a rotation center of said rotating substrates.

2. A chemical vapor deposition apparatus as claimed in claim 1, further comprising a third gas-supply nozzle tube installed vertically in said reaction tube, said third gas-supply nozzle tube having a third vertical gas-emission line, said third vertical gas-emission line having a plurality of third gas-emission holes aligned in a vertical direction, said first gas-emitting-axis intersecting with a third gas-emitting-axis of said third gas-emission holes at a second intersection over said substrate, said second intersection of said first and third gas-emitting axes being deviated from the rotation center of said rotating substrates, said second gas-emitting-axis intersecting with said third gas-emitting-axis at a third intersection over said substrate and said third intersection being deviated from the rotation center of said rotating substrates.

3. A chemical vapor deposition apparatus as claimed in claim 1, wherein said substrate is a round semiconductor wafer, said first intersection being positioned over a portion of said round semiconductor wafer, said portion being inside a semicircle of said round semiconductor wafer on said first and second gas-supply-nozzle-tube-side and outside a circle concentric with said round semiconductor wafer, a radius of said concentric circle being 30% of that of said round semiconductor wafer.

4. A chemical vapor deposition apparatus as claimed in claim 2, wherein said substrate is a round semiconductor wafer, said first, second and third intersections being positioned over a portion of said round semiconductor wafer, said portion being inside a semicircle of said round semiconductor wafer on said first, second and third gas-supply-nozzle-tube-side and outside a circle concentric with said round semiconductor wafer, a radius of said concentric circle being 30% of that of said round semiconductor wafer.

5. A chemical vapor deposition apparatus as claimed in claim 1, wherein said first gas-supply nozzle tube further comprising fourth and fifth vertical gas-emission lines, said first vertical gas-emission line being located between said fourth and fifth vertical gas-emission lines, said fourth vertical gas-emission line having a plurality of fourth gas-emission holes in a vertical direction and said fifth vertical gas-emission line having a plurality of fifth gas-emission holes in a vertical direction.

6. A chemical vapor deposition apparatus as claimed in claim 1, wherein spacings between adjacent ones of said first gas-emission holes and spacings between adjacent ones of said second gas-emission holes are the same as said predetermined interval between adjacent ones of said substrates.

7. A chemical vapor deposition apparatus as claimed in claim 1, further comprising:
    a first branch gas-supply nozzle tube, the top end of said first branch gas-supply nozzle tube being connected to the top end of said first gas-supply nozzle tube and the bottom end of said first branch gas-supply nozzle tube being connected to the bottom end of said first gas-supply nozzle tube;
    a second branch gas-supply nozzle tube, the top end of said second branch gas-supply nozzle tube being connected to the top end of said second gas-supply nozzle tube and the bottom end of said second branch gas-supply nozzle tube being connected to the bottom end of said second gas-supply nozzle tube;
    a first gas-inlet nozzle tube, an end of said first gas-inlet nozzle tube being connected to both ones of the top and the bottom ends of said first gas-supply nozzle tube and said first branch gas-supply nozzle tube; and
    a second gas-inlet nozzle tube, an end of said second gas-inlet nozzle tube being connected to both ones of the top and the bottom ends of said second gas-supply nozzle tube and said second branch gas-supply nozzle tube.

8. A chemical vapor deposition apparatus comprising:
    a reaction tube;
    a substrate-holder installed in said reaction tube, said substrate-holder having a means for holding a plurality of substrates in a vertical direction with a spacing of a predetermined interval between adjacent ones of said substrates, surfaces of said substrates being held horizontally;
a rotating-means for rotating said substrate-holder;
a heating-means for heating said substrates; and
a gas-supply nozzle tube installed vertically in said reaction tube, said gas-supply nozzle tube having first and second vertical gas-emission lines, said first and second vertical gas-emission lines respectively having a plurality of first and second gas-emission holes in a vertical direction.

9. A chemical vapor deposition apparatus comprising:
a reaction tube;
a substrate-holder installed in said reaction tube, said substrate-holder having a means for holding a plurality of substrates with a spacing of a predetermined interval between adjacent ones of said substrates, surfaces of said substrates being held horizontally;
a rotating-means for rotating said substrate-holder;
a heating-means for heating said substrates;
a gas-supply nozzle tube installed vertically in said reaction tube, said gas-supply nozzle tube having a vertical gas-emission line, said gas-emission line having a plurality of gas-emission holes aligned in a vertical direction;
a branch gas-supply nozzle tube, the top end of said branch gas-supply nozzle tube being connected to the top end of said gas-supply nozzle tube and the bottom end of said branch gas-supply nozzle tube being connected to the bottom end of said gas-supply nozzle tube; and
a gas-inlet nozzle tube, an end of said gas-inlet nozzle tube being connected to said branch gas-supply nozzle tube.

10. A chemical vapor deposition apparatus comprising:
a reaction tube;
a substrate-holder installed in said reaction tube, said substrate-holder having a means for holding a plurality of substrates with a spacing of a predetermined interval between adjacent ones of said substrates, surfaces of said substrates being hold horizontally.
a rotating-means for rotating said substrate-holder;
a heating-means for heating said substrates;
a gas-supply nozzle tube installed vertically in said reaction tube, said gas-supply nozzle tube having a vertical gas-emision line, said vertical gas-emission line having a plurality of gas-emission holes aligned in a vertical direction; and
a gas-inlet nozzle tube, an end of said gas-inlet nozzle tube being connected to the center of said gas-supply nozzle tube.

* * * * *